(12) United States Patent
Son et al.

(10) Patent No.: US 8,723,297 B2
(45) Date of Patent: May 13, 2014

(54) MEMORY DEVICE

(75) Inventors: Yoon-Ho Son, Yongin-si (KR); Mong-Sup Lee, Seoul (KR); In-Seak Hwang, Suwon-si (KR); Dae-Hyuk Chung, Seongnam-si (KR); Suk-Hun Choi, Suwon-si (KR); Sang-Jun Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 251 days.

(21) Appl. No.: 13/177,984

(22) Filed: Jul. 7, 2011

(65) Prior Publication Data

US 2012/0025283 A1  Feb. 2, 2012

(30) Foreign Application Priority Data

Jul. 29, 2010  (KR) .................. 10-2010-0073212

(51) Int. Cl.
  *H01L 27/115*  (2006.01)
(52) U.S. Cl.
  USPC .......................................... 257/618; 257/296
(58) Field of Classification Search
  CPC .................... H01L 27/115; H01L 27/10823
  USPC ................................. 257/618, 296
  See application file for complete search history.

(56) References Cited

U.S. PATENT DOCUMENTS

2009/0291541 A1 *  11/2009  Jang et al. ................ 438/270

FOREIGN PATENT DOCUMENTS

| JP | 2005-136097 A | 5/2005 |
| KR | 1999-004939 | 1/1999 |
| KR | 20040063488 A | 7/2004 |

* cited by examiner

*Primary Examiner* — Tran Tran

(74) *Attorney, Agent, or Firm* — Harness, Dickey & Pierce, P.L.C.

(57) ABSTRACT

In a semiconductor device having an enlarged contact area between a contact structure and a substrate, the substrate may include a first region on which a conductive structure is arranged and a second region defining the first region. The first region may include a multi-faced polyhedral recess of which at least one of the sidewalls is slanted with respect to a surface of the substrate. An insulation layer may be formed on the substrate to a thickness that is sufficient to cover the conductive structure. The insulation layer has a contact hole that may be communicated with the recess. The active region of the substrate is exposed through the contact hole. A conductive pattern is positioned in the recess and the contact hole. Accordingly, the contact resistance at the active region of the substrate may be kept to a relatively low value even though the gap distances and line width of pattern lines are reduced.

15 Claims, 20 Drawing Sheets

MEMORY DEVICE

CROSS-REFERENCE TO RELATED APPLICATION

This application claims priority under 35 U.S.C. §119 to Korean Patent Application No. 10-2010-0073212, filed on Jul. 29, 2010 in the Korean Intellectual Property Office, the disclosure of which is incorporated herein in its entirety by reference.

BACKGROUND

1. Field

Example embodiments relate to a memory device and a method of manufacturing the same. More particularly, example embodiments relate to a semiconductor memory device and a method of manufacturing the same.

2. Description of the Related Art

In general, semiconductor devices include at least a wiring for electrically connecting conductive structures such as a transistor and/or a capacitor. The wirings are usually connected to the conductive structures through a contact structure penetrating an insulation interlayer.

As the integration degree of semiconductor devices increase, the thickness of the insulation interlayer and the contact area of the contact structure decrease. Particularly, the reduction of the contact area with the contact structure usually increases electric resistance at a boundary surface between the conductive structures and the contact structure. Thus, the conductive structures may electrically short in the semiconductor device.

For example, when the contact area between a bit line contact and a drain region of a transistor is reduced in a DRAM device, the contact resistance between the bit line contact and the drain region is decreased, which may cause operation failures of the DRAM device. In addition, when a gap distance between neighboring string selection lines is reduced in a flash memory device, the contact area between an active region and a contact structure of a bit line is decreased, which may cause operation failures of the selection transistors.

SUMMARY

Example embodiments of the present inventive concepts relate to a semiconductor memory device having a contact structure of which the bottom portion is slanted with respect to a surface of a substrate to thereby enlarge a contact area between the contact structure and a lower conductive structure.

Example embodiments of the present inventive concepts also relate to a method of manufacturing the above memory device.

According to example embodiments, a semiconductor memory device may include a substrate having a first region on which a conductive structure is arranged and a second region defining the first region, an insulation layer on the substrate to a thickness sufficient to cover the conductive structure and having a contact hole that may be communicated with the recess. The first region of the substrate may include a multi-faced polyhedral recess of which at least one of the sidewalls is slanted with respect to a surface of the substrate and has at least an uneven portion. The uneven portion may also be referred to herein as a laterally projecting portion. The active region of the substrate may be exposed through the contact hole. A conductive pattern may be positioned in the recess and the contact hole.

The sidewalls of the recess may be slanted downward to a point, so that the multi-faced polyhedral recess may be shaped as a multi-faced polyhedral cone. Alternatively, the sidewalls of the recess may be slanted downward to an area (e.g., linear area), so that the multi-faced polyhedral recess may be shaped as a multi-faced wedge.

The uneven portion of the sidewall may include a first component face that may be slanted downward at a first slant angle with respect to the surface of the substrate and a second component face that may be connected to the first component face and slanted downward at a second slant angle with respect to the surface of the substrate. For example, the first slant angle may be in a range of about 65° to about 125° and the second slant angle may be in a range of about 45° to about 55°.

The substrate may include a semiconductor substrate having silicon (Si), and the first and the second regions may include an active region and a field region, respectively, of the semiconductor substrate. The conductive pattern may include a contact structure making contact with the active region of the semiconductor substrate.

The conductive structure may include a gate structure positioned at a gate area of the active region, and the contact structure may include at least one of a storage node contact plug positioned at a source area of the active region and making electrical contact with a capacitor and a bit line contact plug positioned at a drain area of the active region and making electrical contact with a bit line. The contact structure may further include a storage node contact pad positioned on the source area of the active region and making contact with the storage node contact plug.

The conductive structure may include a plurality of string selection transistors, a plurality of cell transistors and a plurality of ground selection transistors that may be positioned on the active region extending along a first direction on the substrate. The contact structure may include at least one of a bit line contact plug interposed between the neighboring string selection transistors on the active region and a common source line interposed between the neighboring ground selection transistors on the active region. The contact structure may further include a bit line contact pad interposed between the neighboring string selection transistors and making contact with the bit line contact plug.

A method of manufacturing the above semiconductor memory device may include forming an insulation layer on a semiconductor substrate. The substrate may have a first region on which a conductive structure is arranged and a second region defining the first region. The conductive structure may be covered with the insulation layer. A contact hole may be formed by patterning the insulation layer, and thus the first region of the substrate may be partially exposed through the contact hole. A multi-faced polyhedral recess may be formed at the exposed first region of the substrate such that at least one of the sidewalls of the recess may be slanted with respect to a surface of the substrate and has an uneven portion. A conductive pattern may be formed in the recess and the contact hole.

The multi-faced polyhedral recess may be formed by a wet etching process using an alkaline etchant in which silicon (Si) of the exposed first region may be etched from the substrate without the removal of silicon (Si) from the insulation layer.

The alkaline etchant may include a mixture of de-ionized water and one of ammonium ($NH_3$) salt and tetra methyl ammonium hydroxide (TMAH, $(CH_3)_4NOH$). Alternatively, the alkaline etchant may include a mixture of hydrogen peroxide ($H_2O_2$), ammonium ($NH_3$), and de-ionized water in which an amount of the hydrogen peroxide is less than about 1% by weight of the mixture.

The wet etching process may be performed at a temperature of about room temperature to about 80° C. For example, the wet etching process may be continuously performed at two or more different temperatures without stopping the wet etching process, so that the sidewalls of the recess may be etched to have a first component face slanted downward at a first slant angle with respect to the surface of the substrate and a second component face continuously connected to the first component face and slanted downward at a second slant angle with respect to the surface of the substrate.

The alkaline etchant for the wet etching process may include a mixture of ammonia and de-ionized water in which an amount ratio of the ammonia and the de-ionized water is about 5:1, and the wet etching process may include a first etching process performed at a temperature of about 60° C. to thereby form the first component face and a second etching process performed consecutively to the first wet etching process at a temperature of about 80° C. to thereby form the second component face.

A pre-cleaning process may be further performed on the surface of the substrate before forming the multi-faced polyhedral recess and a post-cleaning process may be further performed on the slanted sidewalls of the recess before forming the conductive pattern in the recess and the contact hole.

The pre-cleaning process may be performed by one of a dry etching process, a sputtering process, and a reduction process. The dry etching process may be performed by using a mixture gas of oxygen ($O_2$) gas and nitrogen trifluoride ($NF_3$) gas, and the sputtering process and the reduction process may be performed by using a plasma of hydrogen (H) or helium (He). The post-cleaning process may be performed by a wet etching process using an aqueous ammonium ($NH_3$) solution as an etchant.

According to example embodiments of the present inventive concepts, the multi-faced polyhedral recess may be formed at the active region of the substrate so as to be in communication with the contact hole, and the contact structure may be positioned in the contact hole and the recess, thereby enlarging the contact area between the contact structure and the substrate. Therefore, the contact resistance at the active region of the substrate may be kept to a relatively low value although the gap distances and line width of pattern lines may be reduced due to the higher degree of integration of the semiconductor device.

BRIEF DESCRIPTION OF THE DRAWINGS

Example embodiments may be better appreciated and more clearly understood when the following detailed description is taken in conjunction with the accompanying drawings.

DETAILED DESCRIPTION

Figure 1:
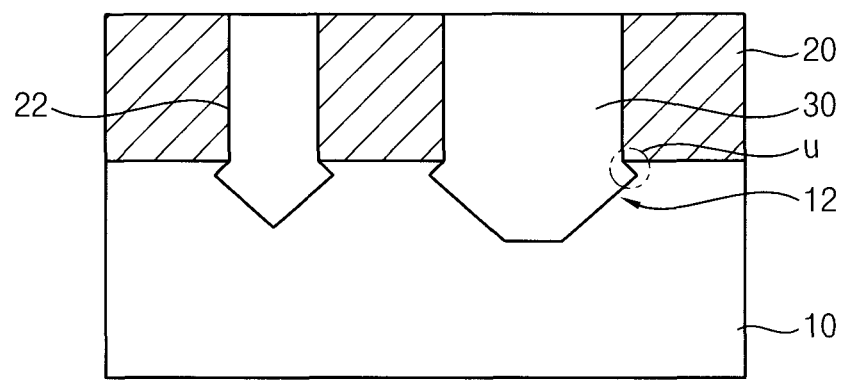
FIG. 1 is a cross-sectional view illustrating a contact structure for a memory device in accordance with a non-limiting example embodiment of the present inventive concepts.

Various example embodiments will be described in further detail hereinafter with reference to the accompanying drawings, in which some example embodiments are shown. The present invention may, however, be embodied in many different forms and should not be construed as limited to the example embodiments set forth herein. Rather, these example embodiments have merely been provided so that this disclosure will be more thorough and complete and will better convey the scope of the present invention to those skilled in the art. In the drawings, the sizes and relative sizes of layers and regions may have been exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in further detail with reference to the accompanying drawings.

Contact Structure and Method of Forming the Same

FIG. 1 is a cross-sectional view illustrating a contact structure for a memory device in accordance with a non-limiting example embodiment of the present inventive concepts.

Referring to FIG. 1, the contact structure 90 for a memory device in accordance with a non-limiting example embodiment of the present inventive concepts may include a substrate 10 on which a plurality of lower conductive structures (not shown) may be arranged, an insulation layer 20 covering the lower conductive structures and having at least a contact hole 22 through which the substrate 10 may be partially exposed and an interconnection pattern 30 that fills up the contact hole 22. For instance, the interconnection pattern 30 may completely fill the contact hole 22.

In a non-limiting example embodiment, the substrate 10 may be formed of a semiconductor material and may include a field region in which a device isolation layer (not shown) may be arranged and an active region defined by the device isolation layer. The lower conductive structures may be arranged on the active region of the substrate 10. For example, the substrate 10 may be formed of a silicon-based material such as silicon (Si) and silicon germanium (SiGe).

The lower conductive structure may include a unit component of the memory device, such as a gate structure of a dynamic random access memory (DRAM) device and a selection or a ground transistor of a flash memory device. For example, the gate structure for the DRAM may include a gate insulation layer on the substrate 10, a conductive line on the gate insulation layer and a spacer covering a sidewall of the conductive line. However, other suitable conductive structures in addition to the gate structures may also be used as the lower conductive structure of the memory device as long as the conductive structures are configured to make contact with the contact structure 90 through the insulation layer or an insulation interlayer.

The insulation layer 20 may electrically insulate neighboring conductive structures and thus the conductive structures on the respective active regions adjacent to each other may electrically function independently from each other. For example, the insulation layer 20 may include silicon oxide ($Si_xO_y$) and silicon nitride ($Si_xN_y$).

The insulation layer 20 may include the contact hole 22 through which the active region of the substrate 10 may be partially exposed. For example, the contact hole 22 may include a bit line contact hole through which a source region of the active region may be exposed around the conductive structure and a storage node contact hole through which a drain region of the active region may be exposed around the conductive structure.

Silicon (Si) may be removed from the exposed portion of the substrate 10 by a wet etching process using an alkaline etchant. Thus, a silicon recess 12 may be formed in a surface of the exposed portion of the substrate 10 at a bottom of the contact hole 22. The silicon recess 12 may be communicated with the contact hole 22 at a portion of the active region. For example, the removal of silicon (Si) may be performed merely from the exposed portion of the substrate 10, not from the insulation layer 20 by the wet etching process. As a result, the silicon recess 12 may be recessed from the surface of the exposed portion of the substrate 10 without damaging the insulation layer 20.

A sidewall of the silicon recess 12 may be slanted downward into the substrate 10 from the surface thereof. For instance, the silicon recess 12 may be shaped as a reversed polyhedral cone or a reversed polyhedral cubic. That is, the sidewall of the silicon recess 12 may be formed into slant faces moving downward into the exposed portion of the active region the substrate 10. Particularly, each slant face of the sidewalls may include a number of component faces having different slant angles with respect to the surface of the substrate 10, and thus the silicon recess 12 may include at least one uneven portion u at each sidewall thereof. As shown in FIG. 1, the uneven portion u laterally projects into the substrate 10. That being said, the uneven portion u may be referred to herein as a laterally projecting portion. Accordingly, the contact area between the active region of the substrate 10 and the interconnection pattern 30 may be enlarged and thus the electric resistance between the interconnection pattern 30 and the substrate 10 may be significantly reduced.

The silicon recess 12 may have various shapes in accordance with the process conditions of the wet etching process and the alignment accuracy between the contact hole 22 and the active region of the substrate 10. Particularly, when the contact hole 22 is misaligned with the active region of the substrate 10 within an allowable process error range, the silicon recess 12 may have various three-dimensional shapes in accordance with the selective etching of silicon (Si) of the active region with respect to an oxide layer or a nitride layer exposed through the contact hole 22.

Figure 2A:
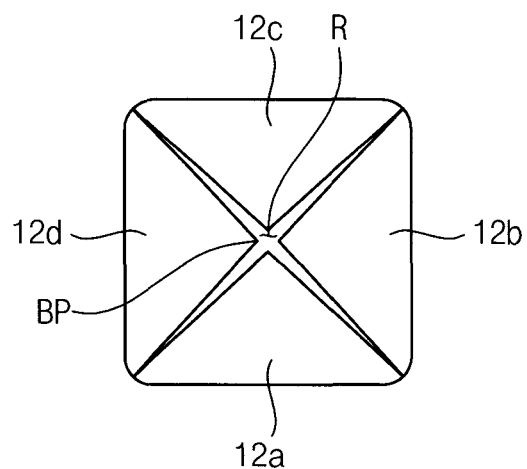
FIGS. 2A to 2C are three-dimensional views illustrating the silicon recess 12 of the contact hole 22 shown in FIG. 1.
Figure 2B:
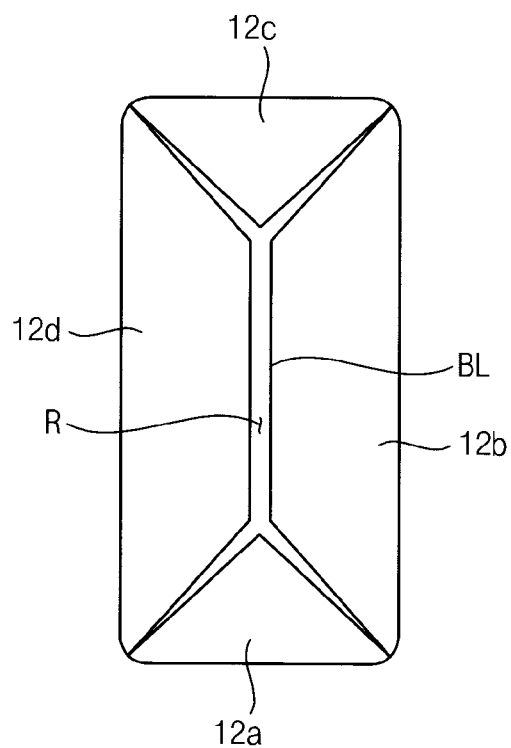
Figure 2C:
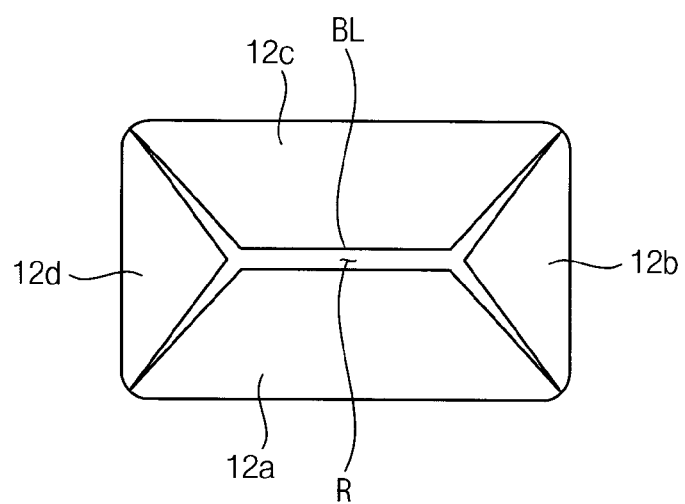

FIGS. 2A to 2C are three-dimensional views illustrating the silicon recess 12 of the contact hole 22 shown in FIG. 1.

Referring to FIGS. 2A to 2C, the silicon recess 12 may include four slant faces 12a to 12d slanted downwards into the substrate 10. The slant faces 12a to 12d may converge downward to a bottom point BP or a bottom line BL. The bottom point BP or the bottom line BL may be positioned at a central portion of the active region that may be exposed through the contact hole 22. Thus, the silicon recess 12 may include a recess space R defined by the slant faces at the bottom portion of the contact hole 22. For example, the silicon recess 12 may be shaped into a three-dimensional structure such as a multi-sided pyramid. The multi-sided pyramid may include a square-based four-sided pyramid and a rectangle-based four-sided pyramid. Conductive materials may be filled into the recess space R of the silicon recess 12 and may function as a lower portion of the interconnection pattern 30.

The slant face may be slanted downward at a slant angle θ with respect to a surface of the substrate 10 and the slant angle θ may be determined by various factors, such as the process conditions of the etching process for forming the silicon recess 12 and crystallization characteristics of the substrate 10.

The silicon recess 12 may be shaped into such a three-dimensional configuration that the contact area between the active region of the substrate 10 and interconnection pattern 30 may be maximized in view of the structural limitations of the memory device and various processing limitations of the manufacturing process for the memory device. For example, at least one of the slant faces of the silicon recess 12 may include at least a pair of component faces of which the normal vectors may cross each other. Thus, the contact area of the silicon recess 12 making contact with the interconnection pattern 30 may be sufficiently enlarged as compared with the case where the slant face is formed into a single face. As a result, the interconnection pattern 30 may make surface contact with the active region of the substrate 10 at the component faces of the silicon recess 12, to thereby enlarge the area of the contact surface between the active region and the interconnection pattern 30. The interconnection pattern 30 may be arranged in the contact hole 22 and the silicon recess 12 that may be communicated with each other. Thus, an upper structure (not shown) on the insulation layer 20 may be electrically connected to the lower conductive structures that may be covered with the insulation layer 20. For example, the interconnection pattern 30 may include a single layer including polysilicon and a metal silicide layer having a polysilicon layer and a metal layer.

The lower portion of the interconnection pattern 30 may be shaped into a pyramid or a multi-faced wedge of which the bottom surfaces may make surface contact with the slant faces 12a to 12d of the active region of the substrate 10. Accordingly, the surface area between the active region of the substrate 10 and the interconnection pattern 30 may be increased, and thus the electrical resistance of the contact structure 90 may be decreased. As a result, the operation failures of the memory device may be sufficiently reduced due to the improved contact structure 90.

Figure 3A:
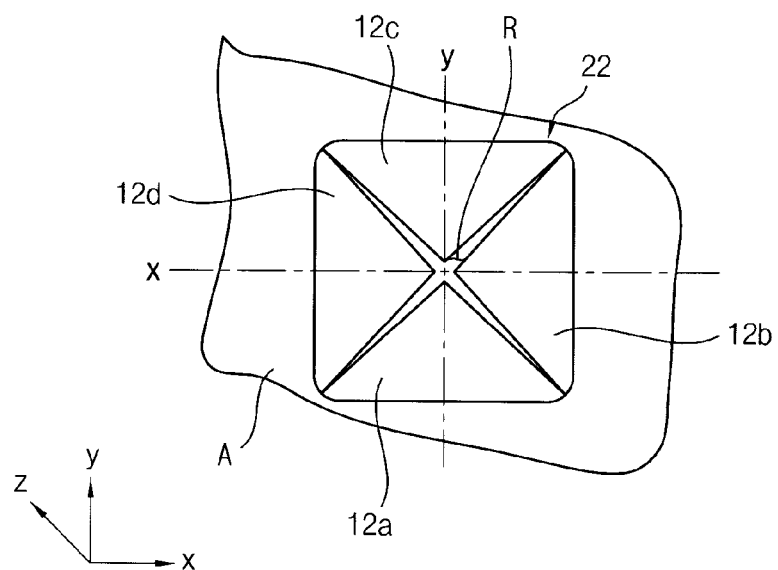
FIGS. 3A and 3B are views illustrating the alignment state of the active region of the substrate and the contact structure shown in FIG. 1.
Figure 3B:
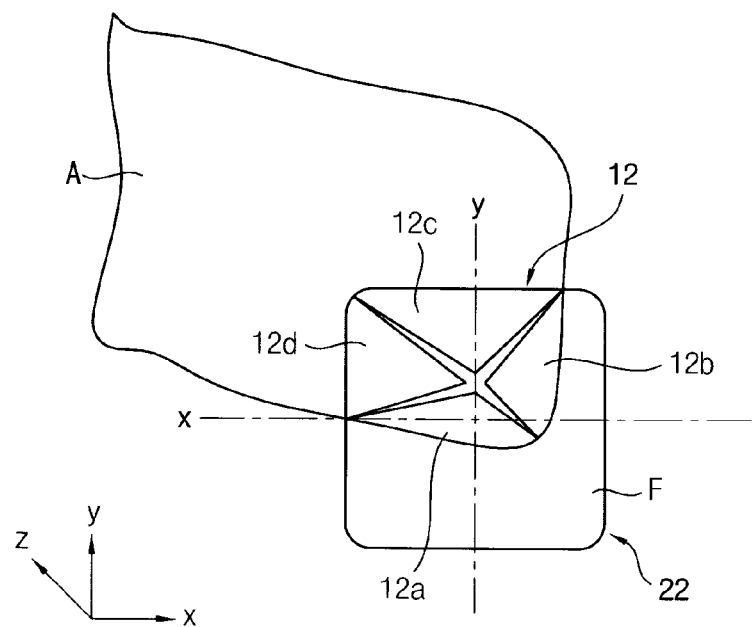

FIGS. 3A and 3B are views illustrating the alignment state of the active region of the substrate and the contact structure shown in FIG. 1. FIG. 3A illustrates that the contact structure 90 is fully aligned with the active region of the substrate 10, while FIG. 3B illustrates that the contact structure 90 is partially aligned or misaligned with the active region of the substrate 10. The contact structure 90 may include the silicon recess 12 shown in FIG. 2A. In FIGS. 3A and 3B, the capital letter 'F' and 'A' denotes a field region and the active region of the substrate 10, respectively.

Referring to FIG. 3A, when the contact hole 22 and the active region A of the substrate 10 are fully aligned with each other, silicon materials of the active region A may be exposed through the contact hole 22 without any oxide layers and/or nitride layers. Thus, the silicon recess 12 may be communicated with a whole bottom portion of the contact hole 22. That is, the silicon (Si) of the active region A may be removed from the substrate 10 and thus the first to fourth slant faces 12a to 12d may converge downward to the bottom point BP at the slant angle θ, respectively. Accordingly, the recess space R may be wholly communicated with the contact hole 22.

In contrast, as illustrated in FIG. 3B, when the contact hole 22 and the active region A of the substrate 10 are misaligned with each other within an allowable error range, an oxide layer and/or a nitride layer 11 (FIG. 4A) on the field region F of the substrate 10 may also be exposed through the contact hole 22 together with silicon materials of the active region A. As a result, the silicon (Si) of the active region A may be selectively etched off by the wet etching process with respect to the oxide layer and/or the nitride layer of the field region F. Thus, the silicon recess 12 may be limited to the active region A of the substrate 10 that is exposed through the contact hole 22. That is, when the contact hole 22 is misaligned with the active region A of the substrate 10, the silicon recess 12 having the first to fourth slant faces 12a to 12d may be positioned only on the exposed active region A, and no silicon recess may be positioned on the exposed field region F at the bottom portion of the contact hole 22.

Figure 4A:
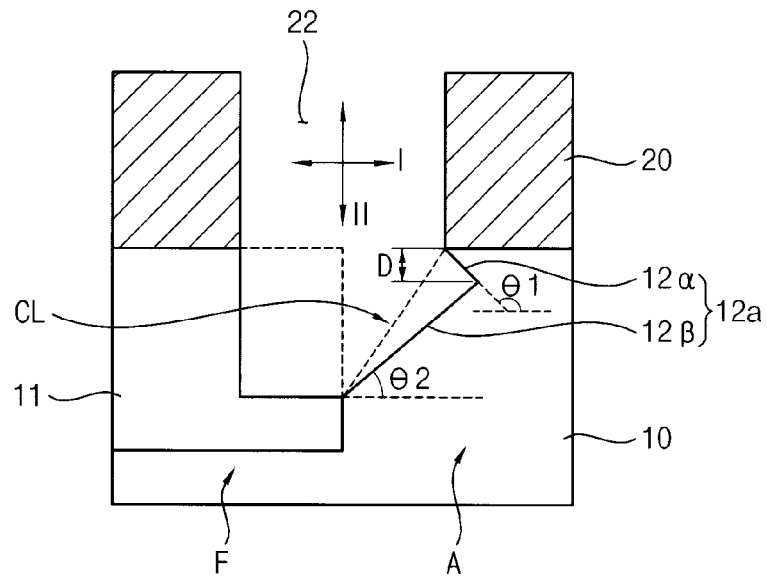
FIGS. 4A and 4B are cross-sectional views illustrating the silicon recess and the contact hole shown in FIG. 3B that may be partially communicated with each other and the contact hole is partially misaligned with the active region of the substrate.
Figure 4B:
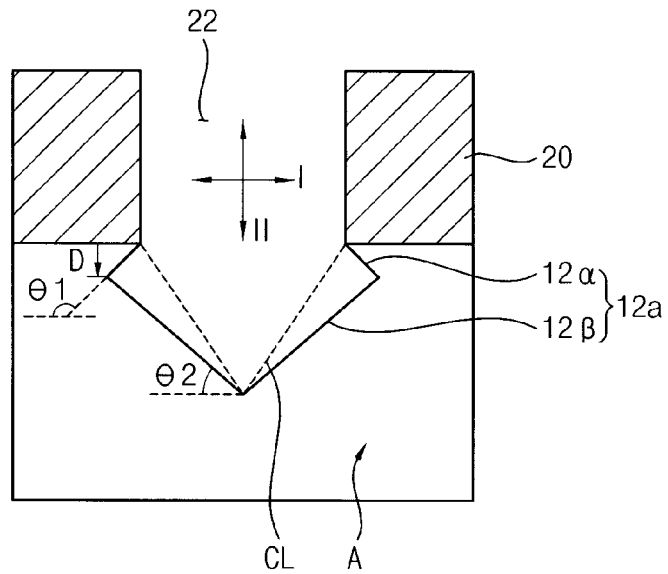

FIGS. 4A and 4B are cross-sectional views illustrating the silicon recess and the contact hole shown in FIG. 3B that may be partially communicated with each other and the contact hole is partially misaligned with the active region of the substrate. FIG. 4A illustrates both of the active region and the field region of the substrate, and FIG. 4B illustrates the active region of the substrate without the field region.

Referring FIGS. 4A and 4B, each of the slant faces 12a to 12d of the silicon recess 12 may include a first component face 12α having a first slant angle θ1 and a second component face 12β having a second slant angle θ2 that is smaller than the first slant angle θ1. Thus, the contact structure 90 may include a three-dimensional bottom portion having a composite face in which the component faces may be slanted downward at different slant angles. For example, the second component face 12β having the second slant angle θ2 shown in FIGS. 4A and 4B may be illustrated in FIGS. 3A and 3B.

The shape of each slant face 12a to 12d may be determined by a ratio of the first and second etching rates of the first and second etching processes against the substrate 10. The first etching process may be performed along a first direction I in parallel with the substrate 10, while the second etching process may be performed along a second direction II perpendicular to the substrate 10. In a non-limiting example embodiment, the first etching rate may be greater than the second etching rate at an upper portion around a surface of the substrate 10. Thus, the substrate 10 may be etched off to a desired depth D from the surface of the substrate 10. When the substrate 10 is etched to the desired depth D, the process conditions may be controlled in such a manner that the first etching process may be decelerated or the second etching process may be accelerated to a rate that is much more than that of the first etching process. That is, the second etching rate may be greater than the first etching rate below the point of the desired depth D. As a result, the slant face 12a of the silicon recess 12 may include the first component face 12α having the first slant angle θ1 and the second component face 12β having a second slant angle θ2 that is smaller than the first slant angle θ1.

Thus, the silicon recess 12 may be formed into a multi-facet recess having at least two component faces, and the contact surface between the interconnection pattern 30 and the active region A of the substrate 10 may be greater than a conventional silicon recess having a single facet. That is, the surface area of the first and the second component faces 12α and 12β is clearly larger than that of the slant face CL of the conventional single facet recess. Therefore, when the interconnection pattern 30 is positioned in the silicon recess 12, the contact area between the interconnection pattern 30 and the active region A may be enlarged, and thus the contact resistance may be sufficiently reduced.

While two component faces having different slant angles are disclosed as forming the slant face of the silicon recess by using two different etching processes, it should be understood that example embodiments are not limited thereto. For instance, it should be understood that three or more etching processes may be performed on the substrate so that the silicon recess may have three or more component faces.

In a non-limiting example embodiment, the first slant angle θ1 may be in a range of about 65° to about 125°, and the second slant angle θ2 may be in a range of about 45° to about 55°. The shape of the silicon recess 12 may be varied in accordance with the size of the first slant angle θ1, which may be an acute angle, a right angle, or an obtuse angle. For example, the size of the first slant angle θ1 may be determined by a selective removal of the active region A of the silicon substrate 10 and the selective removal may be accomplished by controlling the etching conditions such as the etchant compositions and time and temperature of the etching process.

Particularly, when the first slant angle θ1 is greater than about 120°, the contact structure 90 tends to electrically interfere with the neighboring lower conductive structures on the substrate 10. Thus, the first slant angle θ1 may be controlled to be smaller than about 120°.

For example, a bit line contact pad, which may correspond to the contact structure 90 in a dynamic random access memory (DRAM) device, may be positioned under a channel region of a gate structure of the DRAM device. Thus, the gate structure may electrically interfere with the bit line contact pad when the first slant angle θ1 is too large. Particularly, the contact structures adjacent to each other may not be sufficiently insulated from each other electrically due to a recent reduction of critical dimension (CD) of the memory device when the first slant angle θ1 is relatively large. In addition, when the first slant angle θ1 is less than about 65°, the second slant angle θ2 may be substantially close to the first slant angle θ1. Thus, the first etching process for forming the first slant angle θ1 and the second etching process for forming the second slant angle θ2 may not be substantially differentiated from each other in view of the etching conditions. That is, the etching conditions for the second etching process tends to be more difficult to be set differently from those of the first etching process.

Accordingly, the first slant angle θ1 may be in a range of about 65° to about 120° and the second slant angle θ2 may be in a range of about 45° to about 55°. In a non-limiting example embodiment, the second slant angle θ2 may be set to be about 55°.

The first and the second slant angles θ1 and θ2 may be varied in accordance with a width of the contact hole 22, a crystal structure of the substrate 10, and/or a gap distance between neighboring lower conductive structures. For example, when an upper surface of the substrate 10 has a crystal face <100>, the first and the second component faces 12α and 12β may be formed to have a crystal face <110> and a crystal face <111>, respectively. Thus, the surface area of the first and the second component faces 12α and 12β is clearly larger than that of the slant face CL of the conventional single facet recess.

Particularly, a process margin for the contact structure 90 and a width of the gate structure may be reduced according to the high integration degree of recent semiconductor devices. Thus, the contact hole 22 and the active region A of the substrate 10 may be more likely to be misaligned with each other than a situation involving a conventional contact structure. However, although the active region A of the substrate 10 may be misaligned with the contact hole 22 of the contact structure 90, the interconnection pattern 30 of the contact structure 90 may make sufficient contact with the active region A of the substrate 10 since the silicon recess 12 may be formed into a polyhedral shape, to thereby improve reliability of electric connection between the interconnection pattern 30 and the active region A of the substrate 10.

In addition, when the active region A of the substrate 10 and the interconnection pattern 30 make partial contact with each other in semiconductor devices, the contact resistance between the substrate 10 and the interconnection pattern 30 may be significantly increased according to the critical dimension (CD) reduction of the semiconductor device. The enlargement of the contact area between the substrate 10 and the interconnection pattern 30 at the active region A may sufficiently prevent or mitigate the increase of the contact resistance.

According to example embodiments of the contact structure for a semiconductor device, the contact area between the interconnection pattern and the active region of the substrate may be sufficiently enlarged, to thereby prevent or mitigate the increase of the contact resistance of the contact structure. Particularly, even when the contact structure is misaligned with the active region of the substrate, an increase in the contact resistance between the contact structure and the active region of the substrate may be sufficiently prevented or mitigated.

Hereinafter, the process for forming the contact structure 90 will be described in further detail with reference to FIGS. 5A to 5E. FIGS. 5A to 5E are cross-sectional views illustrating processing steps for a method of forming the contact structure shown in FIG. 1.

Figure 5A:
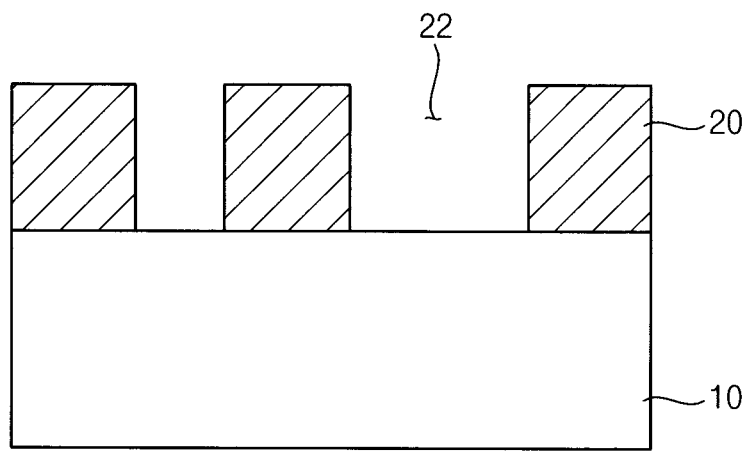
FIGS. 5A to 5E are cross-sectional views illustrating processing steps for a method of forming the contact structure shown in FIG. 1.

Referring to FIG. 5A, the insulation layer 20 having at least one contact hole 22 may be formed on the substrate 10. The substrate 10 may be formed of a semiconductor material and may include a field region in which a device isolation layer (not shown) may be arranged and an active region defined by the device isolation layer. Lower conductive structures may be arranged on the active region of the substrate 10. For example, the substrate 10 may include a silicon-based material such as silicon (Si) and silicon germanium (SiGe).

In a non-limiting example embodiment, various unit processes such as a deposition process, a photolithography process, an etching process and an ion implantation process may be sequentially performed on the substrate 10, thereby forming the lower conductive structures as the unit functional device of the semiconductor device. The lower conductive structure may include a gate structure for a DRAM device and a string selection transistor or a ground selection transistor for a flash memory device.

The insulation layer 20 may be formed on the substrate 10 to a sufficient thickness to cover the lower conductive structures, and thus the lower conductive structures may be electrically insulated from each other by the insulation layer 20. For example, the insulation layer 20 may include a silicon oxide ($Si_xO_y$) and a silicon nitride ($Si_xN_y$). Particularly, the insulation layer 20 may have desirable gap-fill characteristics in view of a relatively high degree of integration of the semiconductor device.

A mask pattern (not illustrated) may be formed on the insulation layer 20 and the insulation layer 20 may be partially removed from the substrate 10 by an etching process using the mask pattern as an etching mask, thereby forming the contact hole 22 through which the substrate 10 may be partially exposed. For example, the etching process may include a dry etching process in which a gas mixture of argon (Ar) gas and tetrafluoromethane ($CF_4$) or trifluoromethane ($CHF_3$) may be used as an etching gas.

Then, the mask pattern may be removed from the insulation layer 20 by an ashing process.

Figure 5B:
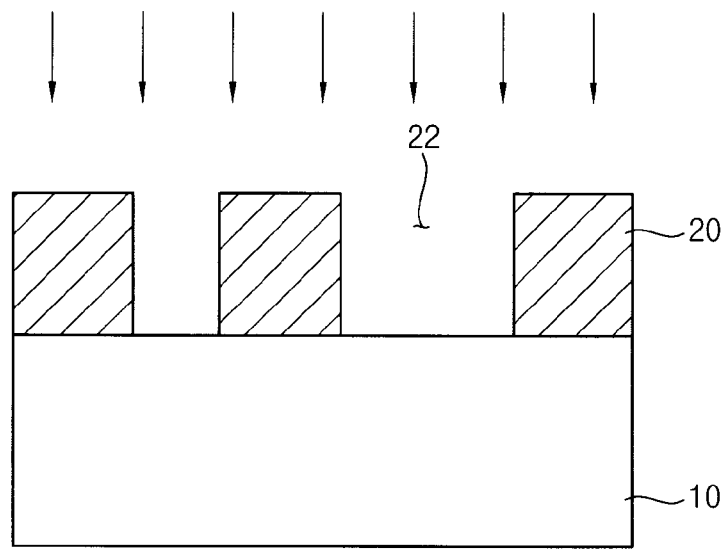

Referring to FIG. 5B, a pre-cleaning process may be performed on a surface of the substrate 10 exposed through the contact hole 22. Thus residuals of the etching process, a native oxide layer, and various damage to the substrate 10 caused by the etching process may be removed from the substrate 10.

For example, the pre-cleaning process may include a dry cleaning process using a mixture of oxygen ($O_2$) and nitrogen trifluoride ($NF_3$) as a cleaning gas. The dry cleaning process may be performed on the exposed surface of the substrate 10 under an etching selectivity of about 1 with respect to the insulation layer 20.

In another non-limiting example embodiment, the residuals of the etching process and/or the native oxide layer may be removed from the exposed surface of the substrate 10 by plasma of a relatively light gas such as hydrogen (H) and/or helium (He). The kinetic energy of the relatively light gas may be less than that of a relatively heavy gas such as argon (Ar) gas. Thus, the pre-cleaning process may take a longer process time when using the plasma of the relatively light gas than when using the plasma of the relatively heavy gas. However, the pre-cleaning process using the plasma of the relatively light gas may be controlled more accurately than the pre-cleaning process using the plasma of the relatively heavy gas. As a result, the native oxide layer may be more sufficiently removed from the exposed surface of the substrate 10 by the pre-cleaning process using the relatively light gas as compared with the pre-cleaning process using the relatively heavy gas. For example, the native oxide layer may be removed from the exposed surface of the substrate 10 via a sputtering process or a reduction process using hydrogen plasma and/or helium plasma.

In a non-limiting example embodiment, only silicon (Si) may be removed from the exposed surface of the substrate 10 through the contact hole 22, and the silicon recess 12 may be formed at the bottom portion of the exposed substrate 10. In such a case, the native oxide layer on the surface of the substrate 10 exposed through the contact hole 22 may be sufficiently removed by a dry cleaning process using plasma.

Figure 5C:
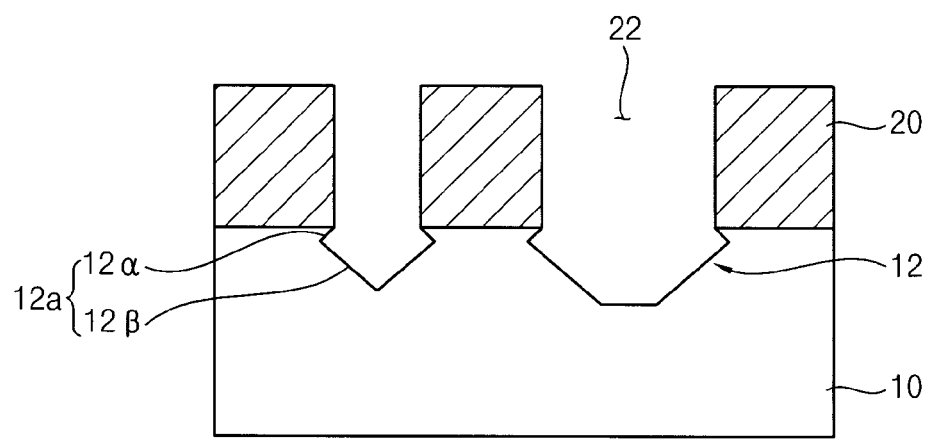

Referring to FIG. 5C, the substrate 10 exposed through the contact hole 22 may be recessed by an etching process, thereby forming the silicon recess 12 at the bottom portion of the contact hole 22.

For example, a wet etching process using an alkaline etchant may be performed on the exposed surface of the substrate 10. As a result, the silicon (Si) in the substrate 10 may be removed from the exposed surface of the substrate 10 without any removal of silicon (Si) in the insulation layer 20. Thus, the substrate 10 may be prevented from damage caused by the plasma process for the conventional dry etching process against the substrate 10. That is, the silicon (Si) may be removed from the exposed portion of the substrate 10 without any damage to the substrate 10.

The alkaline etchant may include a mixture of de-ionized water and an ammonium ($NH_3$) salt or a TMAH (tetra methyl ammonium hydroxide ($CH_3$)$_4$NOH) salt. Alternatively, the alkaline etchant may include a standard clean 1 (SC-1) solution that may be a mixture of de-ionized water, hydrogen peroxide ($H_2O_2$) and ammonium ($NH_3$). In such a case, the amount of the hydrogen peroxide ($H_2O_2$) may be less than about 1 weight percent (wt %) in the SC-1 solution. Thus, the insulation layer 20 including, for instance, an oxide or a nitride may be prevented from being etched off in the wet etching process. The wet etching process may be performed at a temperature of about room temperature (e.g., 20-25° C.) to about 80° C.

The compositions of the etchant and the temperature may be varied in the wet etching process for removing the silicon (Si) in the substrate 10 in such a way that the etching rate against the substrate 10 along the first direction I or the second direction II may be varied with respect to each other. Thus, the sidewalls of the silicon recess 12 may be slanted with respect to the surface of the substrate 10 at a slant angle.

For example, the SC-1 solution may be prepared in such a composition that ammonia and de-ionized water may be mixed at a ratio of about 5:1. The first wet etching process using the SC-1 solution as an etchant may be performed on the substrate 10 to a desired depth D for about 2 seconds at a temperature of about 40° C. Then the second wet etching process using the same SC-1 solution may be performed on the substrate 10 at a temperature of about 80° C. Thus, the substrate 10 may be etched off by the consecutive first and second etching processes. As a result, the silicon recess 12 may have the first and second component faces 12α and 12β at the sidewalls thereof. The first and second component faces 12α and 12β may be slanted with respect to the surface of the substrate 10 at the first and second slant angles θ1 and θ2, respectively.

During the first wet etching using the above SC-1 solution as an etchant at the temperature of about 40° C., the substrate 10 may be etched more in a horizontal direction than in a vertical direction or a downward direction, thereby forming the first component face 12a having the first slant angle θ1 (which is larger than the second slant angle θ2). In contrast, during the second wet etching using the above SC-1 solution as an etchant at the temperature of about 80° C., the substrate 10 may be etched more in the vertical direction than in the horizontal direction, thereby forming the second component face 12β having the second slant angle θ2 (which is smaller than the first slant angle θ1).

Therefore, the control of the composition of the etchant and the temperature of the wet etching process may determine the number of the component faces and the slant angle of each component face. As a result, the silicon recess 12 may be formed into a polyhedral wedge. While example embodiments disclose that the composition of the etchant and the process temperature of the wet etching process may be controlled so as to determine the slant angles of the component faces 12α and 12β and the overall shape of the silicon recess 12, it should be understood that other factors known to one of the ordinary skill in the art may also be controlled in place of or in conjunction with the composition and temperature so as to vary the shape of the silicon recess 12.

Figure 5D:
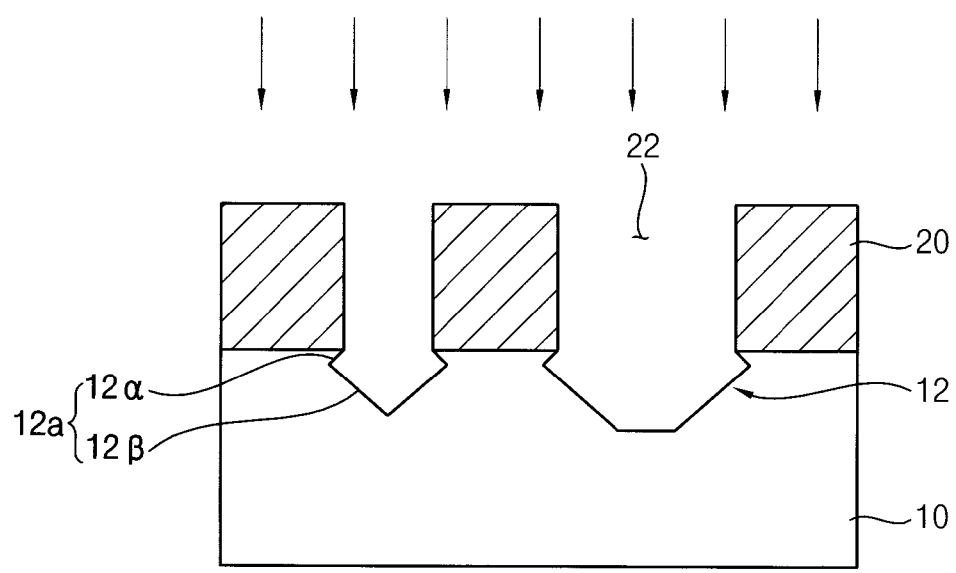

Referring to FIG. 5D, a post treatment may be performed on the component faces 12α and 12β of the silicon recess 12, thereby removing the native oxide layer from each of the component faces 12α and 12β.

For example, the post treatment may include a dry etching process or a wet etching process. The dry etching process for the post treatment may include a hydrogen (H) annealing process and a hydrogen (H) plasma process. The wet etching process for the post treatment may be performed using an etchant such as an aqueous hydrogen fluoride (HF) solution, an aqueous ammonia solution, and a mixture of an aqueous hydrogen fluoride (HF) solution and ammonium fluoride ($NH_4F$). Particularly, a buffered oxide etching (BOE) process may be performed as the post treatment by using the mixture of an aqueous hydrogen fluoride (HF) solution and ammonium fluoride ($NH_4F$) as an etchant.

In a non-limiting example embodiment, a wet etching process using a diluted ammonia aqueous solution as an etchant may be performed on the component faces 12α and 12β. Thus, hydrogen (H) ions on the component faces 12α and 12β may be transformed into hydroxyl (OH) ions, thereby preventing the formation of the native oxide layer on the component faces 12α and 12β of the silicon recess 12.

Figure 5E:
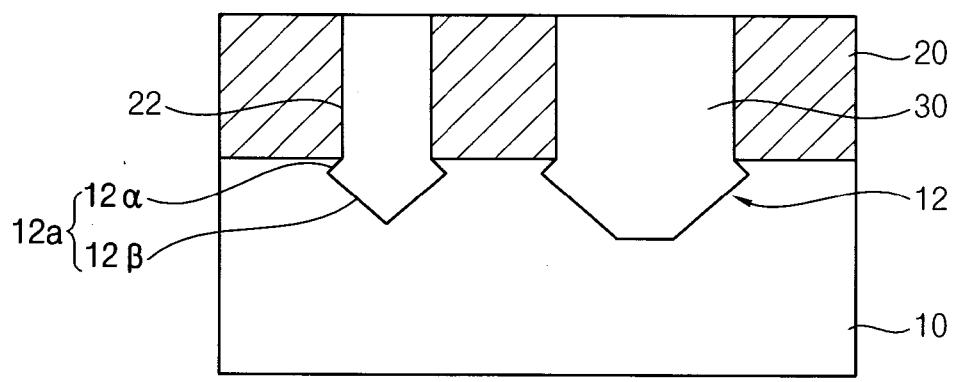

Referring to FIG. 5E, the interconnection pattern 30 may be formed in the silicon recess 12 and the contact hole 22.

In a non-limiting example embodiment, a conductive layer (not illustrated) may be formed on the insulation layer 20 to a sufficient thickness to fill up the silicon recess 12 and the contact hole 22. For example, a polysilicon layer having desirable gap-fill characteristics may be formed on the insulation layer 20 by a relatively high density plasma chemical vapor deposition (HDPCVD) process 20 to a sufficient thickness to fill up the silicon recess 12.

The conductive layer may be planarized by a planarization process such as a CMP process and an etch-back process until an upper surface of the insulation layer 20 is exposed. Therefore, the conductive layer may remain merely in the silicon recess 12 and the contact hole 22 to thereby form the interconnection pattern 30 which fills up the silicon recess 12 and the contact hole 22.

As a result, a lower portion of the interconnection pattern 30 may be shaped into a polyhedral cone or a multi-faced wedge in accordance with the shape of the silicon recess 12. That is, the interconnection pattern 30 may make multiple contacts with the active region of the substrate 10, and thus the contact area of the interconnection pattern 30 and the active region A of the substrate 10 may be sufficiently enlarged. Accordingly, the electrical resistance of the contact structure 90 may be reduced or minimized, and the semiconductor device including the contact structure 90 may be sufficiently prevented from operation failures.

While example embodiments disclose the silicon recess 12 being formed at the active region A of the substrate 10, it should be understood that the silicon recess 12 may be formed at other desired portions of the semiconductor device. For example, when a contact pad is arranged on the active region of the substrate 10 and a contact plug is arranged on the contact pad in a semiconductor device, the silicon recess 12 may also be formed at the contact pad. That is, the silicon recess 12 may be formed in a surface of an object as long as the silicon (Si) of the object is to be selectively removed by a wet etching process using an alkaline etchant.

DRAM Device and Method of Manufacturing the Same

Figure 6:
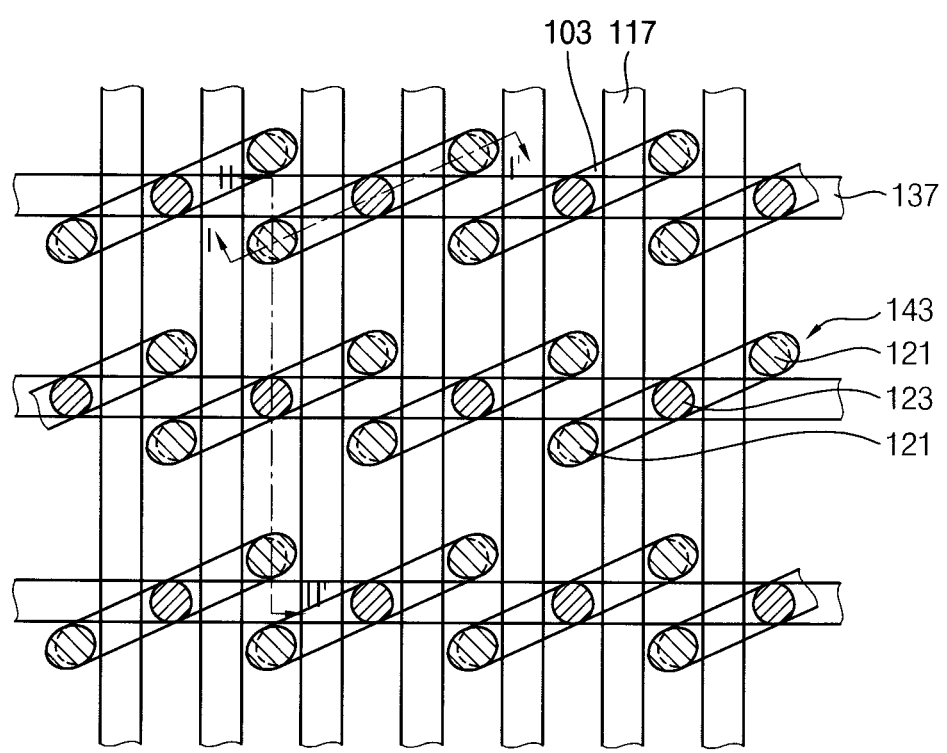
FIG. 6 is a plan view illustrating a DRAM device including the contact structure shown in FIG. 1.
Figure 7A:
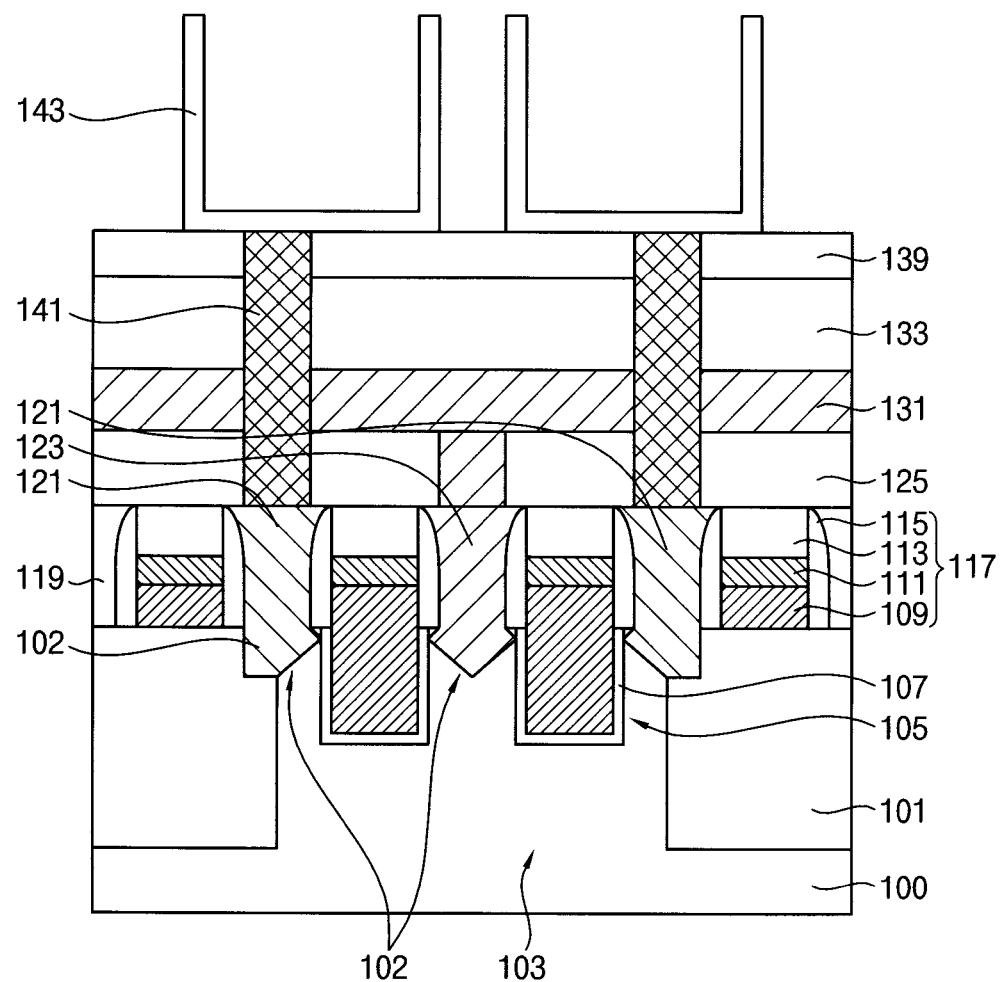
FIG. 7A is a cross-sectional view taken along a line I-I' of the DRAM device shown in FIG. 6.

FIG. 6 is a plan view illustrating a DRAM device including the contact structure shown in FIG. 1. FIG. 7A is a cross-sectional view taken along a line I-I' of the DRAM device shown in FIG. 6, while FIG. 7B is a cross-sectional view taken along a line II-IF of the DRAM device shown in FIG. 6.

Figure 7B:
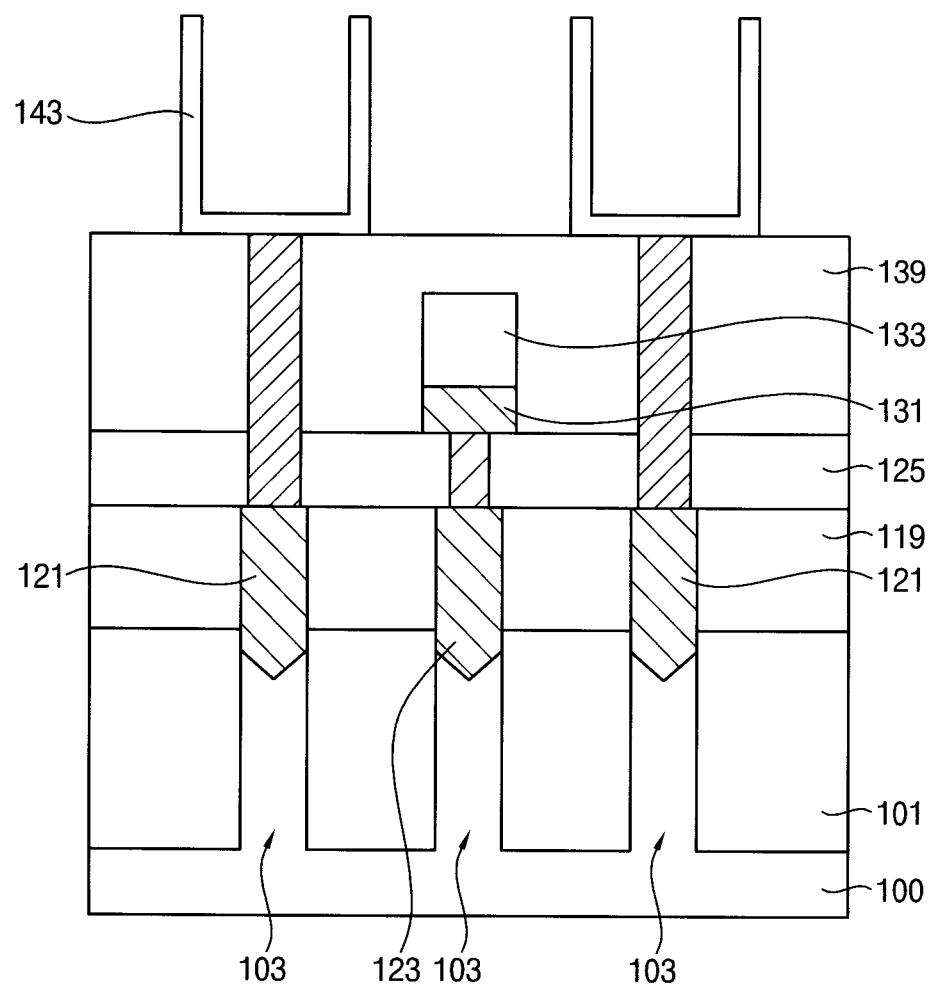
FIG. 7B is a cross-sectional view taken along a line II-II' of the DRAM device shown in FIG. 6.

Referring to FIGS. 6, 7A, and 7B, a DRAM device 500 in accordance with a non-limiting example embodiment of the present inventive concepts may include the contact structure 90 shown in FIG. 1 having a multi-faced wedge shape at a lower portion thereof.

In a non-limiting example embodiment, the DRAM device 500 may include a semiconductor substrate 100 on which an active region 103 may be defined by a device isolation layer 101, and a channel trench 105 may be arranged at the active region 103. A gate conductive pattern may be positioned in the channel trench 105. The gate conductive pattern may include a gate insulation layer 107 covering inner surfaces of the channel trench 105 of the active region 103, a polysilicon pattern 109 filling up the recessed portion of the active region 103 and protruding upward from an upper surface of the substrate 100, and a metal silicide pattern 111 positioned on the polysilicon pattern 109. A gate capping pattern 113 may be positioned on the gate conductive pattern, and a gate spacer 115 may be positioned on sidewalls of the gate capping pattern 113 and the gate conductive pattern. The gate conductive pattern, the gate capping pattern 113, and the gate spacer 115 may be formed into a gate pattern 117 of the DRAM device 500.

The gate pattern 117 may be shaped into a line extending in a first direction across the active region 103. Hereinafter, the line-shaped gate pattern 117 may also be referred to as a gate line. The gate line 117 and the active region 103 may cross each other at various intersection angles according to a crystal structure of the substrate 100.

An insulation layer 119 may be formed on an entire surface of the substrate 100 including the gate pattern 117 in such a configuration that gap spaces between the neighboring gate patterns 117 may be filled with the insulation layer 119. Thus, the gate pattern 117 may be electrically insulated from each other by the insulation layer 119. The insulation layer 119 may include a number of contact holes through which the active region 103 interposed between the neighboring gate patterns 117 may be exposed. A bit line contact pad 121 and a storage node contact pad 123 may be arranged in the contact holes. The gate line 117 may function as a word line of the DRAM device 500. A number of insulation interlayers may be arranged on the insulation layer 119 and the contact pads 121 and 123 and a bit line contact plug and a storage node contact plug may make contact with the bit line contact pad 121 and the storage node contact pad 123, respectively, through the insulation interlayers. The bit line contact pad 121 and the storage node contact pad 123 may be electrically insulated from each other by the insulation interlayers. A bit line 131 and a capacitor 143 may be electrically connected to the bit line contact plug and the storage node contact plug, respectively, in such a configuration that the bit line 131 and the capacitor 143 may be electrically insulated from each other by the insulation interlayers.

The storage node contact pad 123 and the bit line contact pad 121 may be positioned in a silicon recess 102 of the active region 103 that may be shaped into a polyhedral cone or other multi-faced wedge at the active region 103 of the substrate 100. Thus, the contact area of the contact pads 121 and 123 and the active region 103 of the substrate 100 may be sufficiently enlarged due to the multi-face structure of the silicon recess 102. Particularly, when the storage node contact pad 123 is spaced apart from the active region 103 of the substrate 100, the storage node contact pad 123 may make sufficient contact with the active region 103 to thereby reduce the contact resistance between the storage node contact pad 123 and the active region 103. That is, the storage node contact pad 123 may make contact with each component face of the polyhedral-shaped silicon recess 102 at the active region 103. As a result, the contact area between the storage node contact pad 123 and the active region 103 may be sufficiently enlarged in spite of a misalignment between the storage node contact pad 123 and the active region 103 of the substrate 100. Therefore, the electrical resistance of the contact pads 121 and 123 may be reduced or minimized due to the enlargement of the contact area, thereby reducing or preventing operation failures of the DRAM memory device 500.

While example embodiments disclose the enlargement of the contact area between the active region 103 and the contact pads 121 and 123, it should be understood that other contact areas in the DRAM device 500 known to one of the ordinary skill in the art may also be enlarged by the polyhedral-shaped silicon recess 102. For example, the contact areas between the contact pads and the contact plugs such as a bit line contact plug and the storage node contact plug may also be enlarged by the same polyhedral-shaped silicon recess 102.

Hereinafter, the method of manufacturing the DRAM device shown in FIGS. 6, 7A, and 7B will be described in further detail with reference to FIGS. 8A to 9B. Particularly, the manufacturing method will be described intensively around the formation of the contact hole having the polyhedral silicon recess at a bottom thereof.

Figure 8A:
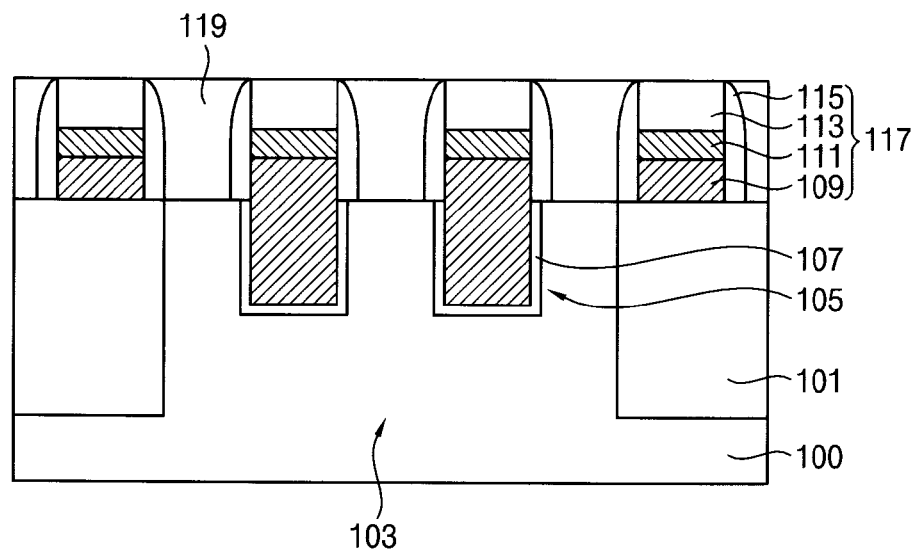
FIGS. 8A and 8B are cross-sectional views illustrating processing steps for a method of forming the insulation layer of the DRAM device shown in FIG. 6.
Figure 8B:
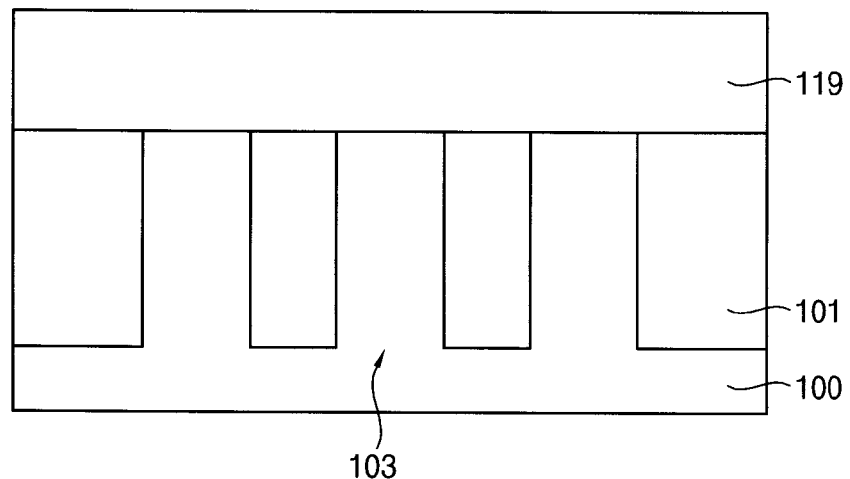
Figure 9A:
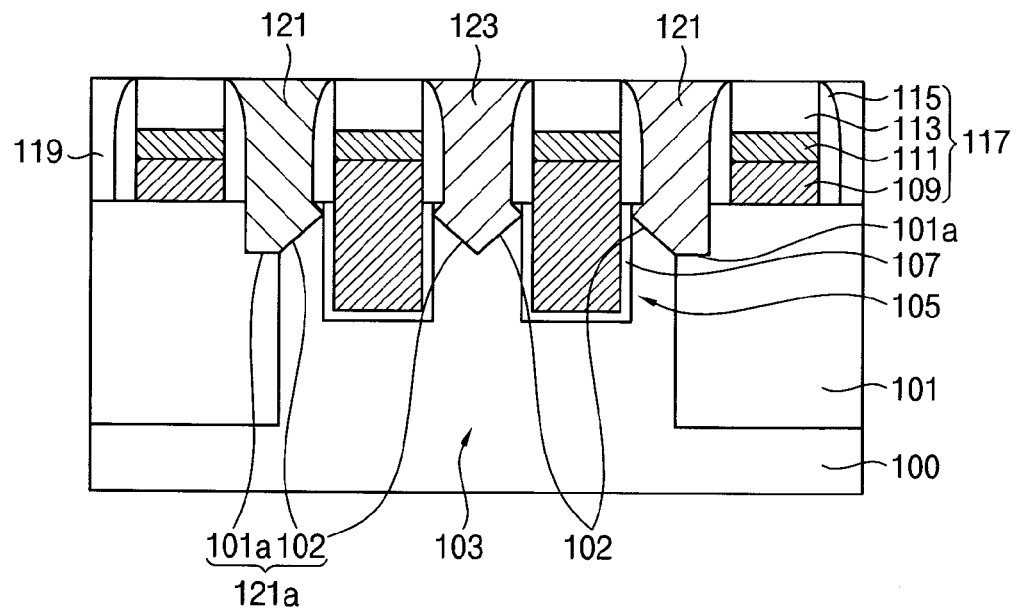
FIGS. 9A and 9B are cross-sectional views illustrating processing steps for a method of forming the contact structure of the DRAM device shown in FIG. 6.
Figure 9B:
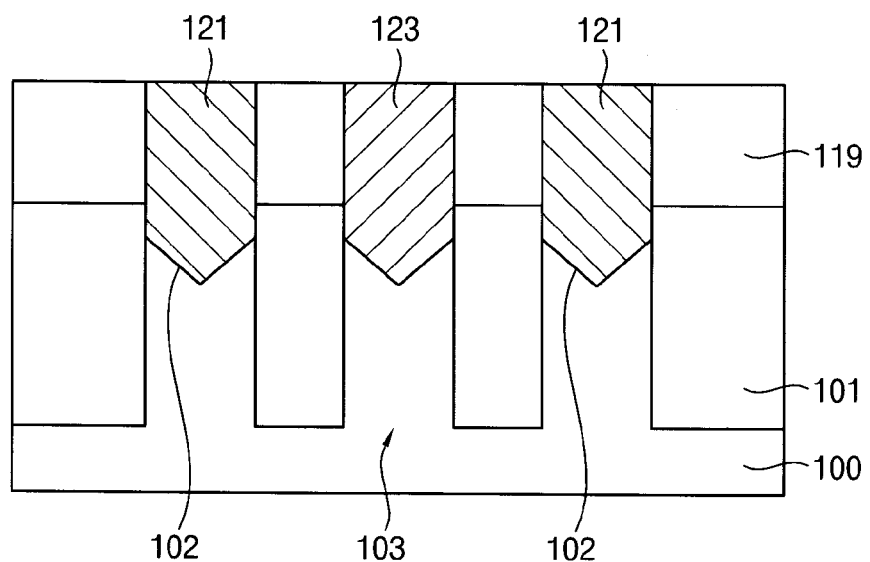

FIGS. 8A and 8B are cross-sectional views illustrating processing steps for a method of forming the insulation layer of the DRAM device shown in FIG. 6. FIGS. 9A and 9B are cross-sectional views illustrating processing steps for a method of forming the contact structure of the DRAM device shown in FIG. 6. FIGS. 8A and 9A are cross-sectional views taken along a line I-I' of the DRAM device shown in FIG. 6 and FIGS. 8B and 9B are cross-sectional views taken along a line II-II' of the DRAM device shown in FIG. 6.

Referring to FIGS. 8A to 9B, the insulation layer 119 may be formed on an entire surface of the substrate 100 to a sufficient thickness to cover the gate pattern 117 in such a manner that the neighboring gate patterns 117 may be electrically insulated from each other. Then, the insulation layer 119 may be partially removed from the substrate 100 to thereby form the contact hole through which the active region 103 of the substrate 100 may be partially exposed between the neighboring gate patterns 117. Thereafter, the silicon recess 102 having the same structures as described with reference to FIG. 5C may be formed on the exposed substrate 100 through the contact hole.

That is, the silicon recess 102 may be formed into a polyhedral shape like a multi-face wedge as shown in FIGS. 2A to 2C and 4A to 4B. In a non-limiting example embodiment, a first contact hole, which may function as a storage node contact hole, may be misaligned with the active region 103 of the substrate 100 and thus the substrate surface at the active region 103 and the device isolation layer 101 at the field region may be partially exposed through the first contact hole. Then, an anisotropic etching process may be performed on the exposed device isolation layer and the surface of the substrate 100 in the first contact hole.

The device isolation layer 101 in the first contact hole may be etched off downwardly in such a manner that an etched surface of the device isolation layer may be parallel with the upper surface of the substrate 100. In contrast, the silicon (Si) of the active region 103 in the first contact hole may be selectively etched off by the same anisotropic etching process and thus at least two slant faces having different slant angles may be formed at the active region 103 of the substrate 100. The removal of the device isolation layer 101 may provide an isolation recess 101a and the selective removal of the silicon (Si) of the substrate 100 at the active region 103 may provide the silicon recess 102 having at least two component faces at a sidewall thereof. Therefore, the isolation recess 101a may have a horizontal bottom and the silicon recess 102 may have a slant bottom. The isolation recess 101a and the silicon recess 102 may be formed into a bottom recess 121a of the first contact hole together with each other. The bottom recess 121a may be continuously communicated with the first contact hole. The first contact hole may extend into the substrate 100 and the device isolation layer 101, and the bottom recess 121a may function as a bottom portion of the contact hole. Accordingly, although the first contact hole may be misaligned with the active region 103 of the substrate 100 within an allowable process error margin, a first contact structure such as the storage node contact pad 123 in the first contact hole may make multiple contacts with the active region 103 of the substrate 100 at the component faces of the silicon recess 102. Thus, the contact area between the storage node contact pad 123 and the active region 103 may not be adversely reduced in spite of the misalignment of the first contact structure and the active region 103 of the substrate 100.

In contrast, a second contact hole, which may function as a bit line contact hole, may be correctly aligned with the active region 103 of the substrate 100. Thus, the active region 103 of the substrate 100 may be exposed through the second contact hole without the device isolation layer 101. That is, the bottom recess 121a may just include the silicon recess 102, and the silicon recess 102 may be symmetrical with respect to a central line of the second contact hole. Then, an anisotropic etching process may be performed on the exposed surface of the substrate 100 in the second contact hole to thereby form the silicon recess 102 shaped into the multi-face wedge symmetrical to the central line of the second contact hole. The silicon recess 102 may be formed by the same process as described with reference to FIG. 5C. Thus, further descriptions regarding the formation process for the silicon recess 102 will be omitted for purposes of brevity.

Then, the bottom recess 121a and the contact hole may be filled with polysilicon, and thus the first contact structure 121 (e.g., bit line contact pad) and the second contact structure 123 (e.g., storage node contact pad) may be formed in the contact holes.

Therefore, the contact area between the contact structures 121 and 123 and the active region 103 of the substrate 100 may be sufficiently enlarged, and the contact resistance between the contact structures 121 and 123 and the active region 103 may be prevented from increasing although a gap distance between the neighboring gate lines 117 may be reduced due to the higher degree of integration of the DRAM device.

Thereafter, a bit line insulation layer 125 may be formed on the substrate 100 including the contact structures 121 and 123 in such manner that the bit line insulation layer 125 may include a plurality of bit line contact holes through which the second contact structures 123 may be exposed. Then, a bit line 131 may be formed on the bit line insulation layer 125 in such a manner that the contact structures 121 and 123 may make contact with the bit line 131 through the bit line contact holes. In a non-limiting example embodiment, the second contact structure 123 may be replaced with a bit line contact pad that may be formed together with the bit line 131 in a body. Otherwise, the second contact structure 123 may be connected with the bit line 131 via a bit line contact plug.

Thereafter, an insulation interlayer 133 may be formed on the bit line insulation layer 125 and the bit line 131 in such a manner that the insulation interlayer 133 may include a plurality of node contact holes extending through it so that the first contact structures 121 may be exposed. Then, conductive materials may be filled into the node contact holes to form a conductive plug making contact with the first contact structure 121 in the node contact hole, thereby forming a plurality of storage node contact plugs 141. Then, an upper insulation interlayer 139 may be formed on the insulation interlayer 133 and the bit line insulation layer 125. Thus, the storage node contact plugs 141 may be electrically insulated from one another by the upper insulation interlayer 139. A capacitor 143 may be formed on the upper insulation interlayer 139 in such a manner that the storage node contact plug 141 may make contact with the capacitor 143, thereby providing the DRAM device 500.

According to example embodiments of the DRAM device, the multi-face wedge type silicon recess may be provided at the surface of the active region of the substrate and thus the contact areas between the active region and the first contact structure and between the active region and the second contact structure may be sufficiently enlarged in the DRAM device. Therefore, the contact resistance between the first and the second contact structures and the active region of the substrate may be sufficiently prevented from being increased in spite of a gap reduction between the gate lines of the DRAM device.

Flash Memory Device and Method of Manufacturing the Same

Figure 10:
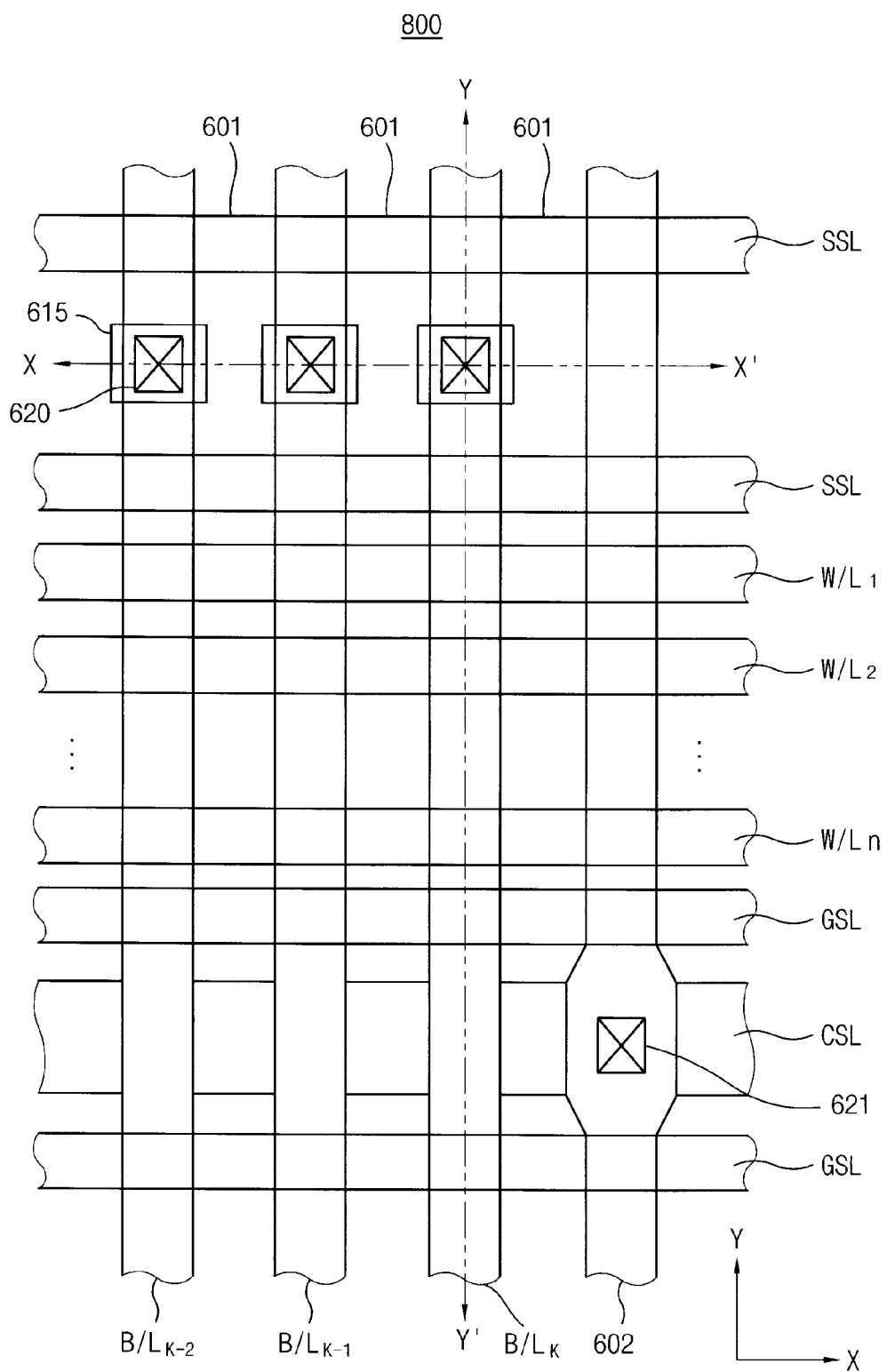
FIG. 10 is a plan view illustrating a flash memory device including the contact structure shown in FIG. 1.
Figure 11A:
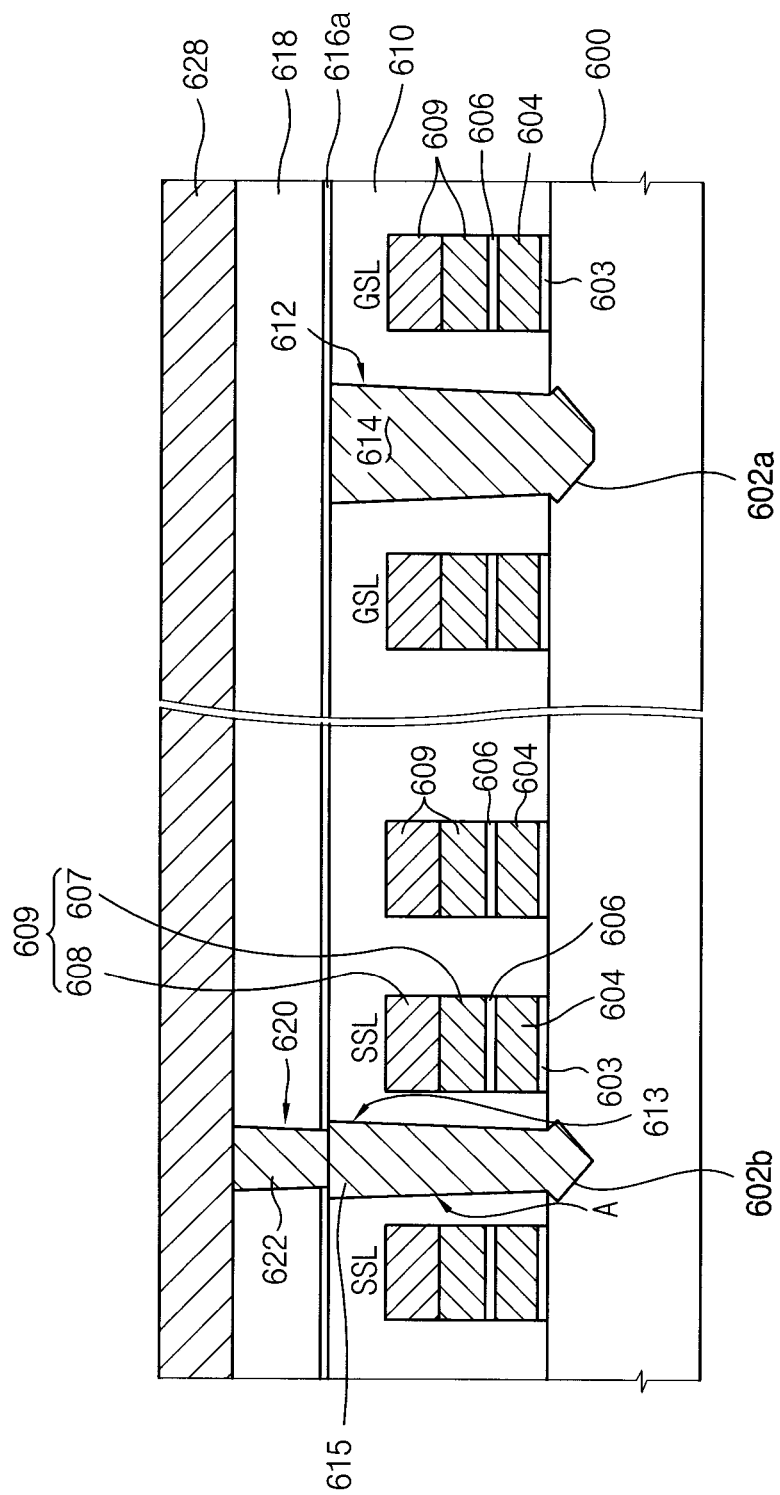
FIG. 11A is a cross-sectional view taken along a line Y-Y' of the flash memory device shown in FIG. 10.

FIG. 10 is a plan view illustrating a flash memory device including the contact structure shown in FIG. 1. FIG. 11A is a cross-sectional view taken along a line Y-Y' of the flash memory device shown in FIG. 10, while FIG. 11B is a cross-sectional view taken along a line X-X' of the flash memory device shown in FIG. 10.

Figure 11B:
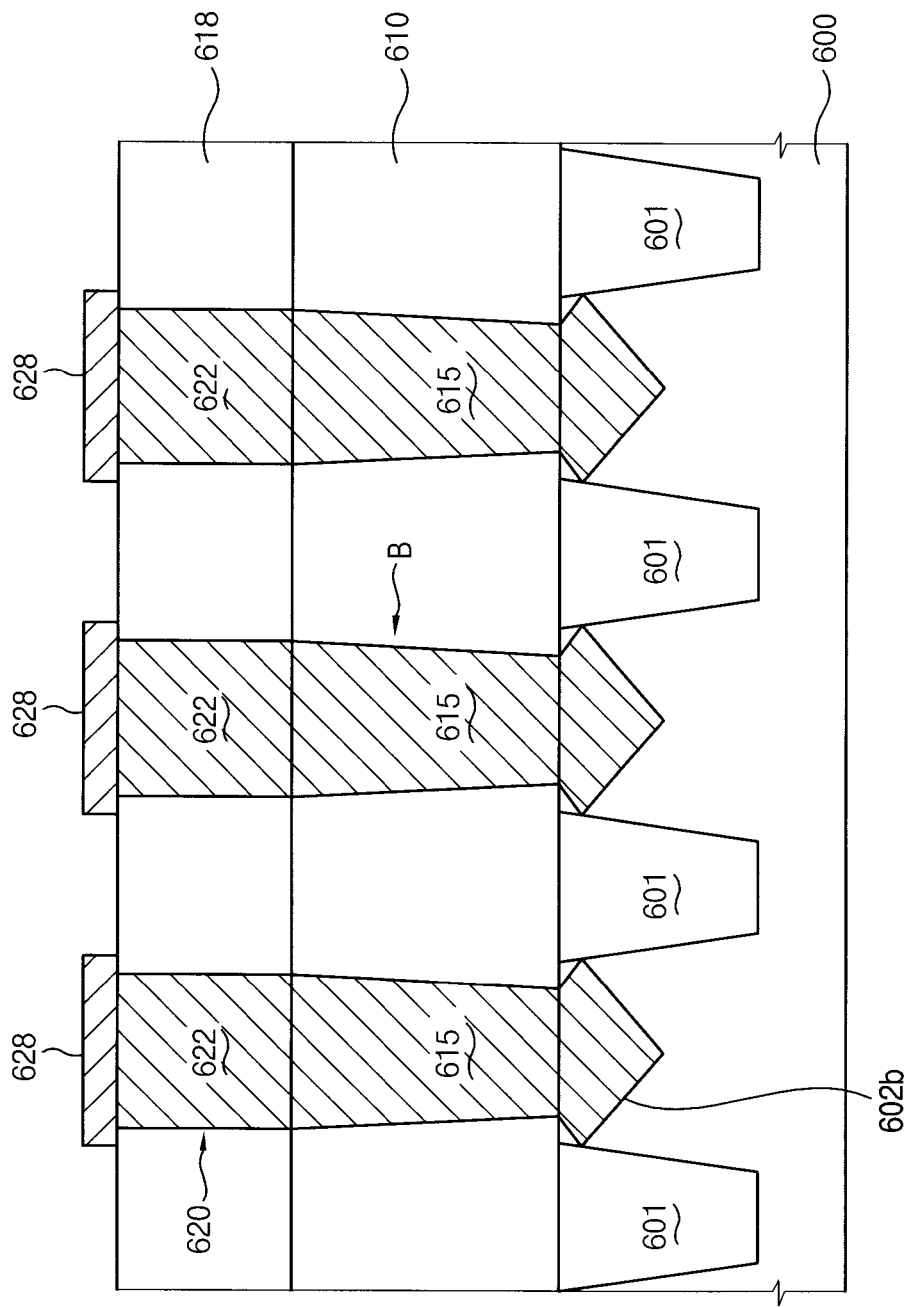
FIG. 11B is a cross-sectional view taken along a line X-X' of the flash memory device shown in FIG. 10.

Referring to FIGS. 10, 11A, and 11B, a flash memory device 800 in accordance with a non-limiting example embodiment of the present inventive concepts may include a plurality of active regions 602 and field regions 601 on the substrate 600 that may extend in a y-axis direction and an x-axis direction, respectively. The active regions 602 may be defined by the field regions 601, and channel regions and source/drain regions of the flash memory device 800 may be positioned on the active regions 602 of the substrate 600.

A number of word lines $W/L_1, W/L_2, \ldots, W/L_n$ extending in the x-axis direction may be repeated in the y-axis direction and may cross the active regions 602 of the substrate 600 at which a cell transistor may be positioned. Each of the cell transistors may be formed into a stack gate structure having a floating gate 604 and a control gate 609. The source/drain regions, which may include relatively highly doped impurity regions, may be arranged on surface portions of the active regions 602 interposed between the word lines $W/L_1, W/L_2, \ldots, W/L_n$. While example embodiments disclose that the active regions 602 may be substantially perpendicular to the word lines $W/L_1, W/L_2, \ldots, W/L_n$ on the substrate 600, it should be understood that the word lines $W/L_1, W/L_2, \ldots, W/L_n$ may also cross the active regions 602 at other angles (as well as at a right angle) in accordance with a crystal structure of the substrate 600.

Therefore, a plurality of the cell transistors may be positioned at each cross point of the active regions 602 extending in the y-axis direction and the word lines $W/L_1, W/L_2, \ldots, W/L_n$ extending in the x-axis direction, thereby forming a memory cell array of the flash memory device 800. In addition, a string selection line (SSL) may be positioned adjacent to and parallel with the first word line $WL_1$ and a ground selection line (GSL) may be positioned adjacent to and parallel with the last word line $WL_1$. Thus, the SSL, the memory cell array and the GSL may be formed into a unit memory "cell string" of the flash memory device 800. In the cell string of the flash memory device 800, the cell transistors may be connected in series along the y-axis direction and thus may have the source/drain regions in common with one another.

A bit line contact hole 620 may be interposed between the neighboring SSLs. A pair of the cell strings (each of which may be designated by a neighboring SSL) may have the bit line contact hole 620 in common with each other (like a mirror image). A first insulation interlayer 610 and a second insulation interlayer 618 may be sequentially formed to cover the word lines $W/L_1, W/L_2, \ldots, W/L_n$. A number of bit lines $B/L_k, B/L_{k-1}, B/L_{k-2}, \ldots, B/L_1$ may be arranged on the second insulation interlayer 618 in such a configuration that the bit lines may extend in the y-axis direction and may be repeated in the x-axis direction.

A common source line (CSL) 614 may be interposed between the neighboring GSLs and may extend in the x-axis direction in parallel with the GSL. A metal contact hole 621 may be positioned on the CSL of every group of the bit lines of the cell strings. The CSL 614 may be positioned in a first opening 612 penetrating the first insulation interlayer 610 in such a configuration that a top surface of the CSL 614 may be coplanar with a top surface of the first insulation interlayer 610.

The active region 602 of the substrate 600 may be exposed through the first opening 612 and silicon (Si) of the active region 602 exposed through the first opening 612 may be removed from the substrate 600 by a wet etching process. Thus, a first silicon recess 602a may be positioned at the active region 602 of the substrate 600 exposed through the first opening 612 in such a configuration that at least two component faces may be arranged at each sidewall of the first silicon recess 602a. For example, the first silicon recess 602a may include a multi-face polyhedral shape having a number of slant faces that may be as described in further detail with reference to FIGS. 2A to 2C and 4A to 4B. As a result, the contact area between the CSL 614 and the active region 602 may be sufficiently enlarged. Thus, the contact resistance between the CSL 614 and the substrate 600 may be prevented from being increased although the gap distances between the GSLs may be reduced due to the higher degree of integration of the flash memory device 800.

The active region 602 interposed between the neighboring SSLs may be exposed through a second opening 613 penetrating through the first insulation interlayer 610. The silicon (Si) of the active region 602 exposed through the second opening 613 may be removed from the substrate 600 by a wet etching process. Thus, a second silicon recess 602b may be positioned at the active region 602 of the substrate 600 exposed through the second opening 613 in such a configuration that at least two component faces may be arranged at each sidewall of the second silicon recess 602b. For example, the second silicon recess 602b may also include a multi-face polyhedral shape having a number of slant faces that may be as described in further detail with reference to FIGS. 2A to 2C and 4A to 4B and may be similar to the first silicon recess 602a. Particularly, the second silicon recess 602b may be positioned at a smaller area than the first silicon recess 602a. Thus, the second silicon recess 602b may be shaped into a multi-face wedge, while the first silicon recess 602a may be shaped into a multi-face polyhedron. As a result, the contact area between the CSL 614 and the active region 602 may be sufficiently enlarged. As a result, the contact resistance between the CSL 614 and the substrate 600 may be prevented from being increased although the gap distances between the GSLs may be reduced due to the higher degree of integration of the flash memory device 800. Conductive materials may be filled into the second opening 613 and the second silicon recess 602a, and thus a bit line contact structure 615 may be positioned in the second opening 613. As a result, the contact area between the bit line contact structure 615 and the active region 602 may be sufficiently enlarged, and thus the contact resistance between the bit line contact structure 615 and the substrate 600 may be prevented from being increased although the gap distances between the SSLs may be reduced due to the higher degree of integration of the flash memory device 800.

The CSL 614 may be positioned in the first opening 612 and the first silicon recess 602a, and the bit line contact structure 615 may be positioned in the second opening 613 and the second silicon recess 602b. The top surfaces of the CSL 614 and the bit line contact structure 615 may be coplanar with the top surface of the first insulation interlayer 610.

Accordingly, the contact area between each of the bit line contact structure 615 and the CSL 614 and the active region 602 of the substrate 600 may be sufficiently enlarged, and thus the contact resistance of the CSL 614 and the bit line contact structure 615 may be prevented from being increased although the gap distances between the SSLs and between GSLs may be reduced due to the higher degree of integration of the flash memory device 800.

Hereinafter, the method of manufacturing the flash memory device 800 will be described in further detail with reference to FIGS. 12A to 13B. Particularly, the processing steps for forming the silicon recesses 602a and 602b at bottom portions of the CSL 614 and the bit line contact structure 615, respectively, of the flash memory device 800 will be discussed. It should be understood that various aspects of other processing steps (e.g., conventional techniques) for manufacturing the flash memory device 800 may also be utilized.

Figure 12A:
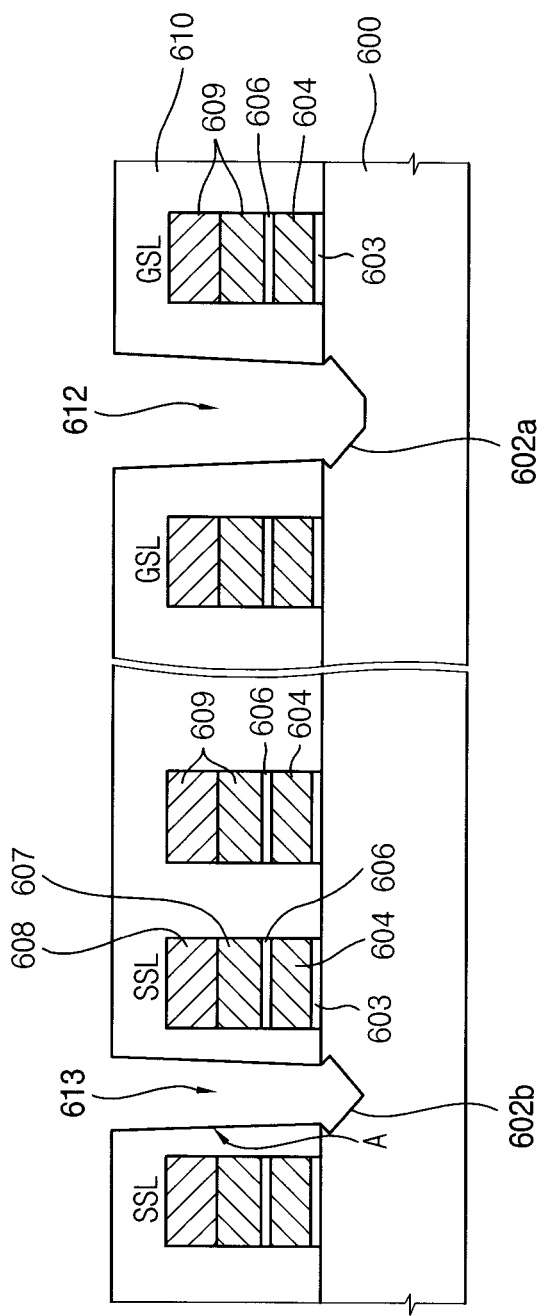
FIGS. 12A and 12B are cross-sectional views illustrating processing steps for a method of forming the first and second openings and the first and second silicon recesses of the flash memory device shown in FIGS. 10, 11A and 11B.
Figure 12B:
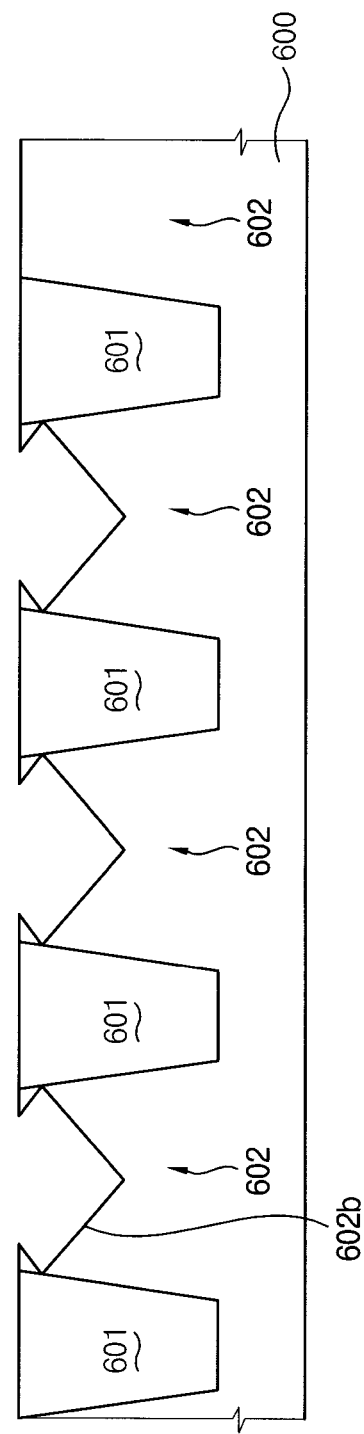

FIGS. 12A and 12B are cross-sectional views illustrating processing steps for a method of forming the first and second openings and the first and second silicon recesses of the flash memory device shown in FIGS. 10, 11A, and 11B.

Referring to FIGS. 12A and 12B, the first insulation interlayer 610 may be partially removed from the substrate 600 by a dry etching process, thereby forming the first and the second openings 612 and 613 through which the active region 602 of the substrate 600 may be exposed. A pre-cleaning process may be further performed on the exposed active region 602 of the substrate 600. Then, a wet etching process using an alkaline etchant may be performed on the exposed active region 602 of the substrate 600. As a result, the silicon (Si) of the active region 602 may be removed from the substrate 600 without any removal of silicon (Si) from the first insulation interlayer 610, thereby forming the first and second silicon recess 602a and 602b at the exposed active region 602 of the substrate 600.

The first and the second openings 612 and 613 and the first and the second silicon recesses 602a and 602b may be formed substantially by the same processes as described with reference to FIGS. 5B to 5D. Thus, further detailed descriptions on the formation process of the openings 612 and 613 and the silicon recesses 602a and 602b will be omitted for purposes of brevity.

Figure 13A:
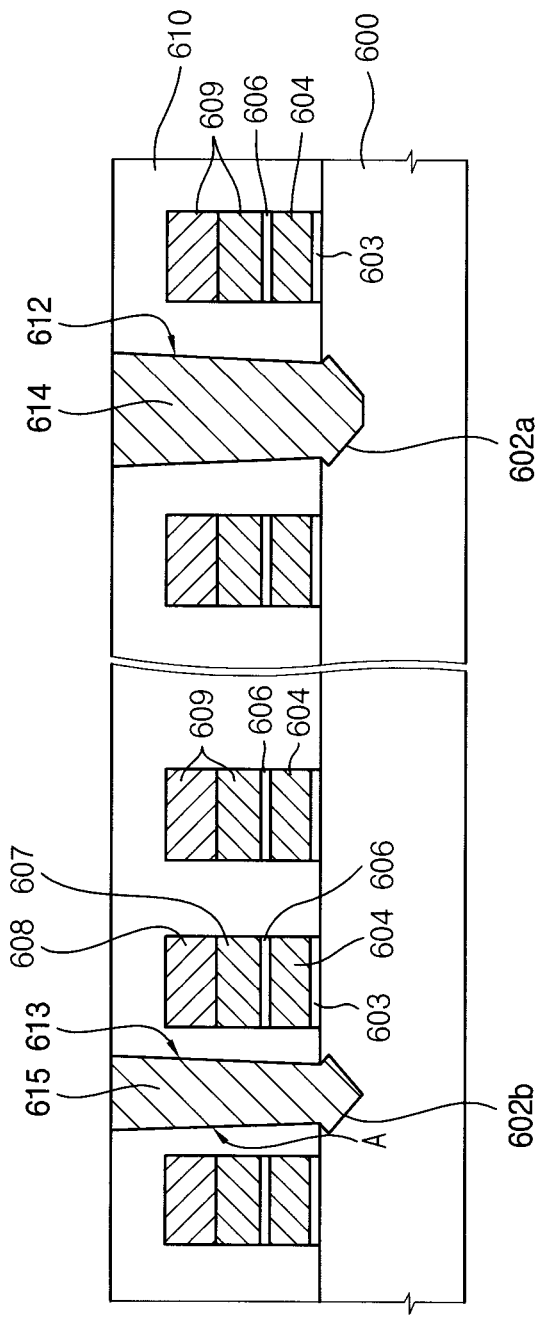
FIGS. 13A and 13B are cross-sectional views illustrating processing steps for a method of forming the CSL and the bit line contact structure of the flash memory device shown in FIGS. 10, 11A and 11B.
Figure 13B:
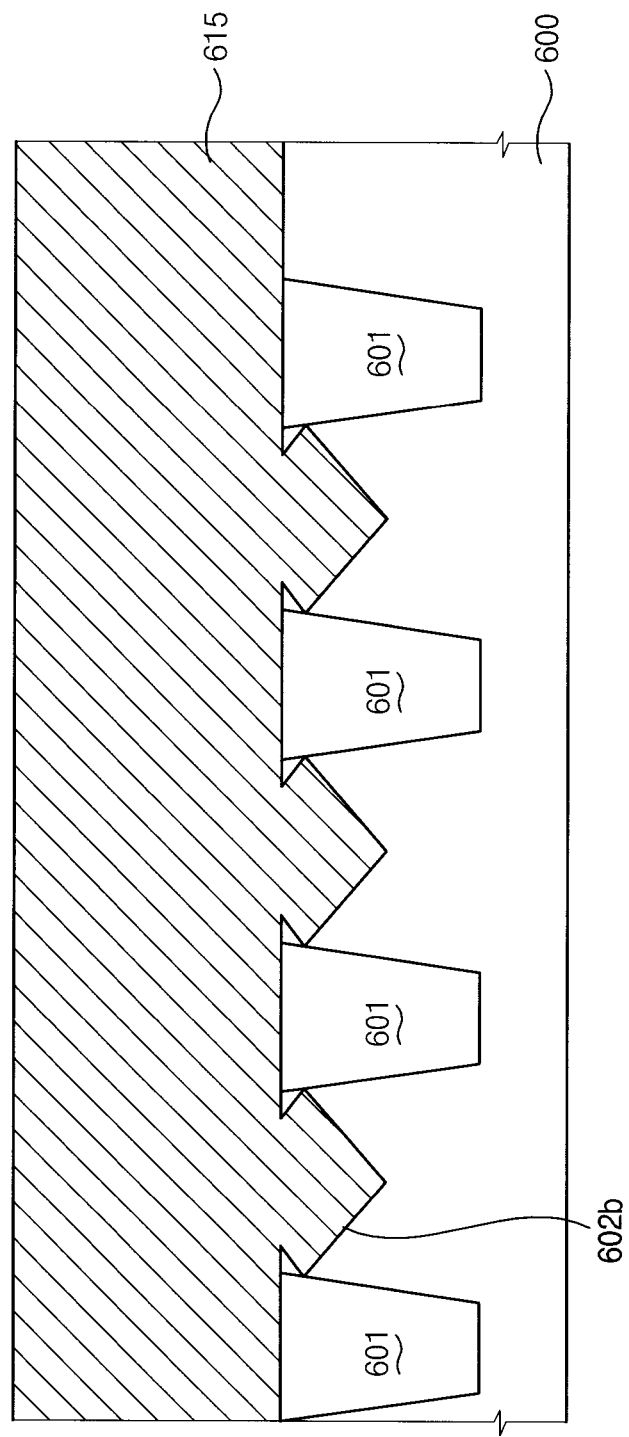

FIGS. 13A and 13B are cross-sectional views illustrating processing steps for a method of forming the CSL 614 and the bit line contact structure 615 of the flash memory device shown in FIGS. 10, 11A, and 11B.

Referring to FIGS. 13A and 13B, a conductive layer (not illustrated) may be formed on the substrate 600 including the first insulation interlayer 610 to a sufficient thickness by a deposition process to fill the first and the second openings 612 and 613 and the first and the second silicon recesses 602a and 602b. Then, the conductive layer may be planarized by a planarization process such as a CMP process and an etchback process until an upper surface of the first insulation interlayer 610 is exposed. Thus, the conducive layer may remain in the first opening 612 and the first silicon recess 602a and in the second opening 613 and the second silicon recess 602b, thereby forming the CSL 614 in the first opening 612 and first silicon recess 602a and the bit line contact structure 615 in the second opening 613 and second silicon recess 602b.

The CSL 614 and the bit line contact structure 615 may be formed substantially by the same process as described in detail with reference to FIG. 5E. Thus, further detailed descriptions on the processing steps for forming the CSL 614 and the bit line contact structure 615 have been omitted for purposes of brevity.

A mask pattern (not illustrated) may be formed on the first insulation interlayer 610 and the bit line contact structure 615 according to a shape of the active region 602 of the substrate 600. The mask pattern may function as an etching stopper during an etching process for forming the bit line contact hole 620 and may also function as an etch mask during an etching process for patterning an underlying conductive layer into the bit line contact structure 615.

The second insulation interlayer 618 may be formed on the mask pattern and the first insulation interlayer 610 and then partially etched off by an etching process to include a bit line contact hole 620 through which the bit line contact structure 615 may be exposed. A bit line contact plug 622 may be formed in the bit line contact hole 620, and a bit line 628 may be formed on the second insulation interlayer 618 so as to make contact with the bit line contact plug 622. Thus, the bit line 628 may be electrically connected to the active region 602 between the neighboring SSLs via the bit line contact plug 622 and the bit line contact structure 615.

According to example embodiments of the flash memory device, the multi-face wedge type silicon recess may be provided at the surface of the active region of the substrate, and thus the contact areas between the active region and the contact structures may be sufficiently enlarged in the flash memory device. Therefore, the contact resistance between the contact structures and the active region of the substrate may be sufficiently prevented from being adversely increased in spite of a gap reduction between the SSLs and the GSLs of the flash memory device.

Memory System

Figure 14:
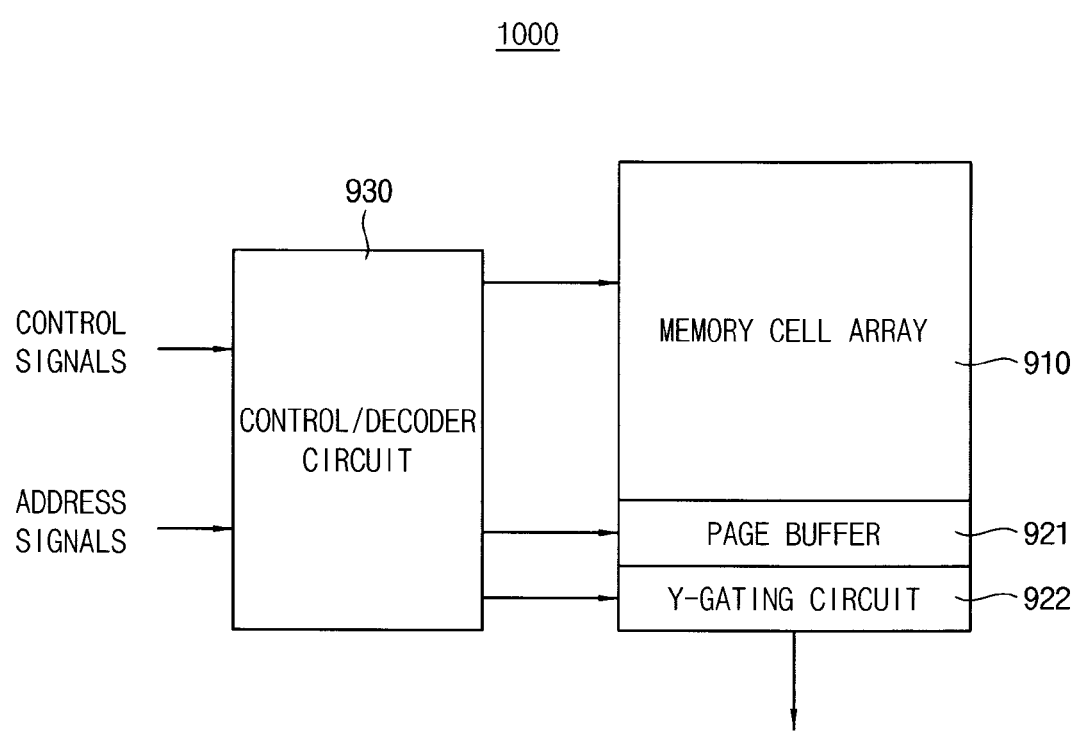
FIG. 14 is a view illustrating a memory system having the contact structure shown in FIG. 1 in accordance with a non-limiting example embodiment of the present inventive concepts.

FIG. 14 is a view illustrating a memory system having the contact structure shown in FIG. 1 in accordance with a non-limiting example embodiment of the present inventive concepts. An NAND flash memory system having an NAND memory device may be provided as a memory system. However, it should be understood that an NAND flash memory system is merely illustrative of example embodiments and is not to be construed as limiting thereof. For example, the present inventive concepts may also be applied to a NOR flash memory system having a NOR memory device and other non-volatile memory systems known to those skilled in the art without materially departing from the novel teachings and advantages of the present invention.

Referring to FIG. 14, the memory system 1000 according to a non-limiting example embodiment of the present inventive concepts may include a cell array 910 on which a plurality of memory cells for storing data may be arranged, a page buffer block 921 and a Y-gating circuit 922 for controlling the memory cells in the cell array 910, and a control/decoder circuit 930 for electrically operating the cell array 910, the page buffer block 921, and the y-gating circuit 922. The control/decoder circuit 930 may generate various control signals and address signals in response to external signals. The generated control signals and address signals may be applied to the cell array 910, the page buffer block 921, and the Y-gating circuit 922 by the control/decoder circuit 930.

The memory cells in the cell array 910 may have the same structure as described with reference to FIGS. 10, 11A, and 11B. The electronic information and data may be stored to the memory cells in the cell array 910.

For example, the cell array 910 may include a plurality of memory blocks, and each of the memory blocks may include a plurality of bit lines and a plurality of cell strings electrically connected to one of the bit lines. Each of the cell strings may include a string selection transistor connected to the bit line, a ground selection transistor connected to a common source line, and a plurality of memory cells connected in series between the string selection transistor and the ground selection transistor. Each of the memory cells may include the flash memory device shown in FIGS. 10, 11A, and 11B. Each of the bit lines may be connected to a page buffer in the page buffer block 921.

Each of the page buffers in the page buffer block 921 may be operated by the operation signals transferred from the control/decoder circuit 930 and may provide a buffer space for reading/writing data from/to the memory cells in the cell array 910. The Y-gating circuit 922 may select one of the page buffers in the page buffer block 921 corresponding to some of the memory cells in accordance with the operation signals of the control/decoder circuit 930.

According to the memory system of example embodiments, the contact resistance at the active region of the substrate may be sufficiently low although the gap distances between the SSLs and the GSLs may be reduced. As a result, the aspect ratio of a gap space between the SSLs and the GSLs may be increased in the flash memory device, thereby reducing or minimizing the operational failures of the memory system. Thus, the memory system 1000 may improve system performance (as much as the increase of the integration degree of the flash memory device) without deterioration of the operational reliability.

The above memory system 1000 may be applied to various electronic instruments. For example, various memory cards may be manufactured to have the memory system 1000 based on industrial standards, and the memory cards may be applied to various portable electronic instruments such as a digital camera, a notebook computer, and an MP3 player for storing audio and video data. In such a case, the memory system 100 may further include a decoder (not illustrated) and an encoder (not illustrated) for converting analogue audio, video and image data into respective digital data. In addition, the memory system 1000 may be directly connected to a central processing unit (CPU) of a computer system or may be indirectly connected to the CPU via a bus line, and thus may function as a supplementary memory or a storage device for the computer system.

While the above example memory system describes the use of the flash memory devices shown in FIGS. 10, 11A, and 11B as the memory device in the cell array 910, it should be understood that the DRAM devices shown in 6, 7A, and 7B may also be used as the memory device in the cell array 910, as would be appreciated by one of the ordinary skill in the art.

The foregoing is merely illustrative of example embodiments and is not to be construed as limiting thereof. Although a few non-limiting embodiments have been described, those skilled in the art will readily appreciate that many variations and modifications are possible without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is merely illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor memory device comprising:
   a substrate having a first region on which a conductive structure is arranged and a second region defining the first region, the first region including an active region and a multi-faced polyhedral recess having a plurality of sidewalls, at least one of the sidewalls being slanted with respect to a surface of the substrate, the recess having at least a laterally projecting portion;
   an insulation layer disposed on the substrate to a thickness sufficient to cover the conductive structure, the insulation layer having a contact hole communicated with the recess, the active region of the substrate being exposed through the contact hole; and
   a conductive pattern positioned in the recess and the contact hole, wherein the conductive pattern includes a contact structure making electrical and physical contact with the active region of the substrate.

2. The semiconductor memory device of claim 1, wherein the sidewalls of the recess are slanted downward to a point such that the multi-faced polyhedral recess has a shape of a multi-faced polyhedral cone.

3. The semiconductor memory device of claim 1, wherein the sidewalls of the recess are slanted downward to a linear area such that the multi-faced polyhedral recess has a shape of a multi-faced wedge.

4. The semiconductor memory device of claim 1, wherein the uneven portion includes a first component face that is slanted downward at a first slant angle with respect to the surface of the substrate and a second component face that is connected to the first component face and is slanted downward at a second slant angle with respect to the surface of the substrate.

5. The semiconductor memory device of claim 4, wherein the first slant angle is in a range of about 65° to about 125° and the second slant angle is in a range of about 45° to about 55°.

6. The semiconductor memory device of claim 1, wherein the substrate includes a semiconductor substrate having silicon (Si), the first and the second regions include the active region and a field region, respectively, of the semiconductor substrate.

7. The semiconductor memory device of claim 6, wherein the conductive structure includes a gate structure positioned at a gate area of the active region and the contact structure includes at least one of a storage node contact plug positioned at a source area of the active region and making electrical contact with a capacitor and a bit line contact plug positioned at a drain area of the active region and making electrical contact with a bit line.

8. The semiconductor memory device of claim 7, wherein the contact structure further includes a storage node contact pad positioned on the source area of the active region and making contact with the storage node contact plug.

9. The semiconductor memory device of claim 6, wherein the conductive structure includes a plurality of string selection transistors, a plurality of cell transistors, and a plurality of ground selection transistors positioned on the active region extending along a first direction on the substrate, and the contact structure includes at least one of a bit line contact plug interposed between neighboring string selection transistors on the active region and a common source line interposed between neighboring ground selection transistors on the active region.

10. The semiconductor memory device of claim 7, wherein the contact structure further includes a bit line contact pad interposed between neighboring string selection transistors and making contact with the bit line contact plug.

11. A semiconductor memory device, comprising:
a substrate including a first region and a second region defining the first region, the first region including an active region and a polyhedral recess partially extending into the substrate, the polyhedral recess having at least four slanted faces relative to a surface of the substrate;
an insulation layer on the substrate, the insulation layer having a contact hole exposing the active region of the substrate, the contact hole being in communication with the polyhedral recess; and
a conductive pattern disposed in the contact hole and the polyhedral recess, the conductive pattern having a terminal portion in the form of a polyhedron that corresponds to a shape of the polyhedral recess, wherein the terminal portion makes electrical and physical contact with the active region of the substrate.

12. The semiconductor memory device of claim 11, wherein the polyhedral recess includes at least two upper faces that slant outward and away from each other from an upper surface of the substrate.

13. The semiconductor memory device of claim 12, wherein the polyhedral recess includes at least two lower faces that slant inward and toward each other, the at least two lower faces being below and directly adjacent to the at least two upper faces.

14. The semiconductor memory device of claim 13, wherein a slant angle of the at least two upper faces is greater than a slant angle of the at least two lower faces.

15. The semiconductor memory device of claim 11, wherein the terminal portion of the conductive pattern in the polyhedral recess is wider than the contact hole.

* * * * *